(12) United States Patent  
Kimura

(10) Patent No.: US 7,817,251 B2  
(45) Date of Patent: Oct. 19, 2010

(54) SUPPORTING APPARATUS, EXPOSURE APPARATUS, AND DEVICE MANUFACTURING METHOD

(75) Inventor: Atsushi Kimura, Funabashi (JP)

(73) Assignee: Canon Kabushiki Kaisha, Tokyo (JP)

( * ) Notice: Subject to any disclaimer, the term of this patent is extended or adjusted under 35 U.S.C. 154(b) by 614 days.

(21) Appl. No.: 11/853,506

(22) Filed: Sep. 11, 2007

(65) Prior Publication Data

US 2008/0074635 A1    Mar. 27, 2008

(30) Foreign Application Priority Data

Sep. 22, 2006    (JP) .............................. 2006-257737

(51) Int. Cl.
*G03B 27/58* (2006.01)
*G03B 27/42* (2006.01)
*G03B 27/62* (2006.01)
*H02K 41/02* (2006.01)

(52) U.S. Cl. ............................ 355/72; 355/53; 355/75; 310/12.05; 310/12.06

(58) Field of Classification Search .................... 355/53, 355/72, 75; 310/10, 12.05, 12.06, 12.31; 318/649

See application file for complete search history.

(56) References Cited

U.S. PATENT DOCUMENTS

| 7,064,512 | B2 | 6/2006 | Kimura | 318/649 |
| 7,144,160 | B2 | 12/2006 | Kimura | 384/12 |
| 2003/0202167 | A1* | 10/2003 | Binnard | 355/72 |
| 2005/0002012 | A1 | 1/2005 | Sakino et al. | 355/75 |
| 2005/0036127 | A1 | 2/2005 | Kimura | 355/75 |
| 2005/0185167 | A1 | 8/2005 | Kimura | 355/75 |
| 2005/0218335 | A1 | 10/2005 | Kimura et al. | 250/440.11 |
| 2006/0082754 | A1* | 4/2006 | Sasaki et al. | 355/72 |
| 2006/0103833 | A1 | 5/2006 | Kimura | 355/72 |

FOREIGN PATENT DOCUMENTS

JP    2004-349576    12/2004
WO    WO2004/105105 A1    12/2004

* cited by examiner

*Primary Examiner*—Alan A Mathews
(74) *Attorney, Agent, or Firm*—Fitzpatrick, Cella, Harper & Scinto

(57) ABSTRACT

A supporting apparatus supports a movable element by a bearing. The apparatus has a moment reducing unit that exerts a force on a portion of the movable element, which is different from a portion supported by the bearing. The moment reducing unit reduces a moment that acts on the movable element when the portion of the movable element, which is supported by the bearing, changes as the movable element moves. This stabilizes the attitude of the movable element.

20 Claims, 22 Drawing Sheets

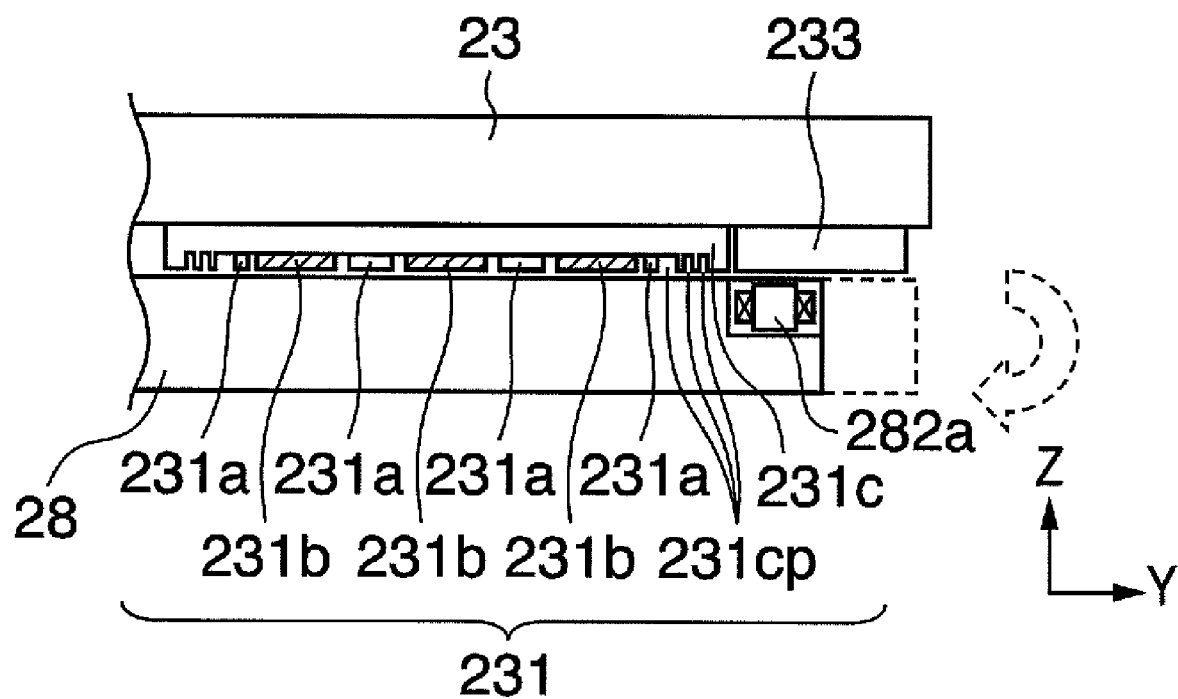

SUPPORTING APPARATUS, EXPOSURE APPARATUS, AND DEVICE MANUFACTURING METHOD

This application claims the benefit of Japanese Patent Application No. 2006-257737, filed Sep. 22, 2006, which is hereby incorporated by reference herein in its entirety.

BACKGROUND OF THE INVENTION

1. Field of the Invention

The present invention relates to a supporting apparatus, an exposure apparatus, and a device manufacturing method.

2. Description of the Related Art

FIG. 12 is a perspective showing a positioning apparatus used in, e.g., an electron beam exposure apparatus disclosed in Japanese Patent Laid-Open No. 2004-349576. FIG. 13 is a sectional view showing the schematic arrangement of a static pressure fluid bearing unit in the positioning apparatus shown in FIG. 12.

For example, a sample holder 65, on which a sample (not shown), such as a semiconductor wafer, is mounted, is set on a sample supporting mechanism 66. An X-Y stage 67 translates the sample holder 65 within an X-Y plane. It is assumed that a stage apparatus is used in a vacuum atmosphere, or the like. When an external fluid supply source (not shown) supplies a fluid, such as air, to feed the fluid with a predetermined pressure to a portion between static pressure fluid bearings 64b and a movable guide 63, the static pressure fluid bearings 64b axially support the movable guide 63 by levitation. A vacuum pump (not shown), connected outside a vacuum container, recovers the fluid injected from the static pressure fluid bearings 64b through labyrinth pockets 64p.

When the movable guide 63 moves, those portions of the movable guide 63, which are supported by the static pressure fluid bearings 64b, change. This causes a shift between the points of action with respect to the movable guide 63 by the static pressure fluid bearings 64b and the barycenter of the movable guide 63, to generate moments indicated by arrows in FIG. 13. Consequently, the gap between the movable guide 63 and static pressure fluid bearings 64b fluctuates. If acceleration or deceleration further acts on the movable guide 63 or if the movable guide 63 stops urgently, the static pressure fluid bearings 64b come into contact with the movable guide 63 and break, in the worst case.

SUMMARY OF THE INVENTION

It is an object of the present invention to stabilize the attitude of a movable element, supported by a bearing, to prevent degradation in accuracy of position.

According to the present invention, a supporting apparatus, for supporting a movable element, comprises a bearing that supports the movable element, and a moment reducing unit that exerts a force on a portion of the movable element, which is different from a portion supported by the bearing, so as to reduce a moment that acts on the movable element, when the portion of the movable element, which is supported by the bearing, changes, as the movable element moves.

The present invention can stabilize the attitude of the movable element supported by the bearing to prevent degradation in accuracy of position.

Further features of the present invention will become apparent from the following description of exemplary embodiments (with reference to the attached drawings).

BRIEF DESCRIPTION OF THE DRAWINGS

FIG. 6 is a sectional view of a static pressure fluid bearing unit, and its vicinity, for a linear motor Y stator in an in-vacuum reticle stage, which is to be applied to a semiconductor exposure apparatus according to the third embodiment;

DESCRIPTION OF THE EMBODIMENTS

The embodiments of the present invention will be described with reference to FIGS. 1 to 15.

First Embodiment

Figure 1:
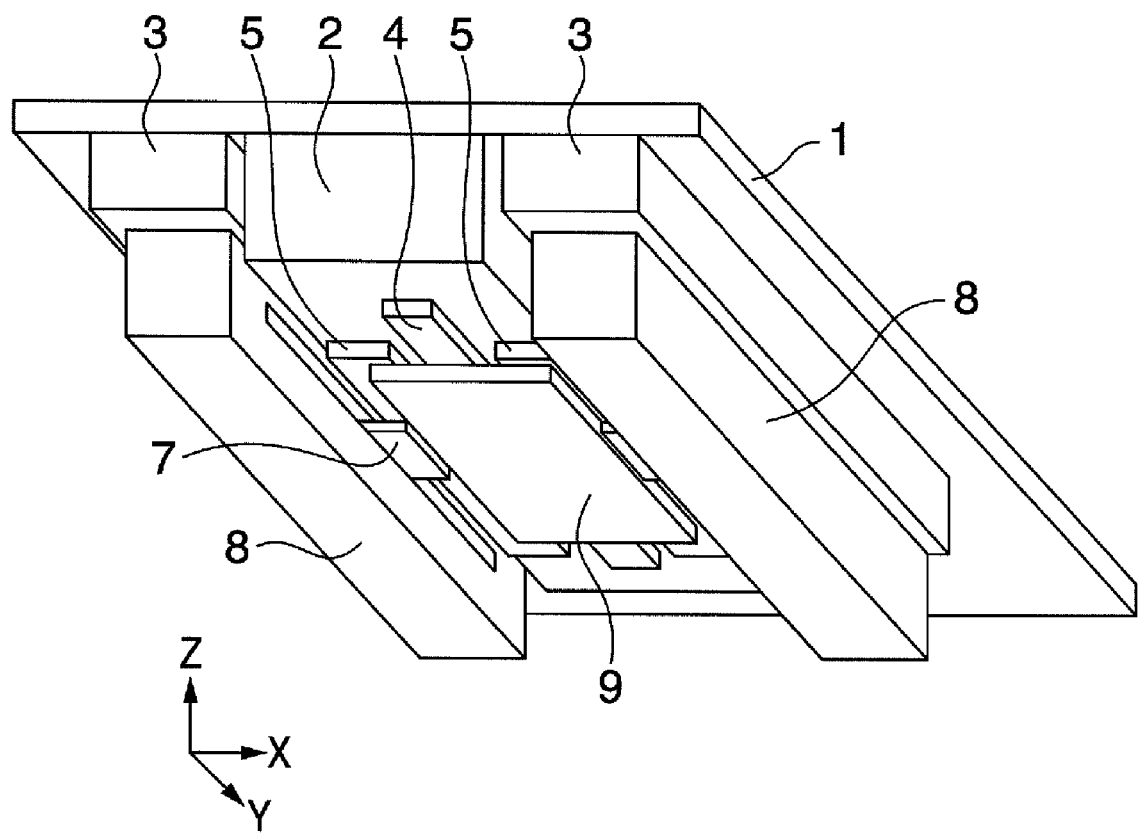
FIG. 1 is a schematic perspective view of an in-vacuum reticle stage, which is to be applied to a semiconductor exposure apparatus, according to the first embodiment.

FIG. 1 is a schematic perspective view showing the arrangement of a reticle stage when the light source has a short wavelength and cannot use a lens, but uses a reflection mirror, as in an EUV (extreme ultra violet rays) exposure apparatus. A slider surface plate 2 is mounted at the central portion of a base surface plate 1, and Y surface plates 3 are mounted on the left and right of the slider surface plate 2. Y feet 5 are respectively arranged on the left and right of the slider surface plate 2, and a slider 9 fixes to the Y feet 5. The Y feet 5 are provided with movable magnets 7, respectively. The movable magnets 7 and Y stators 8, arranged on the Y surface plates 3, constitute a linear motor.

Figure 2A:
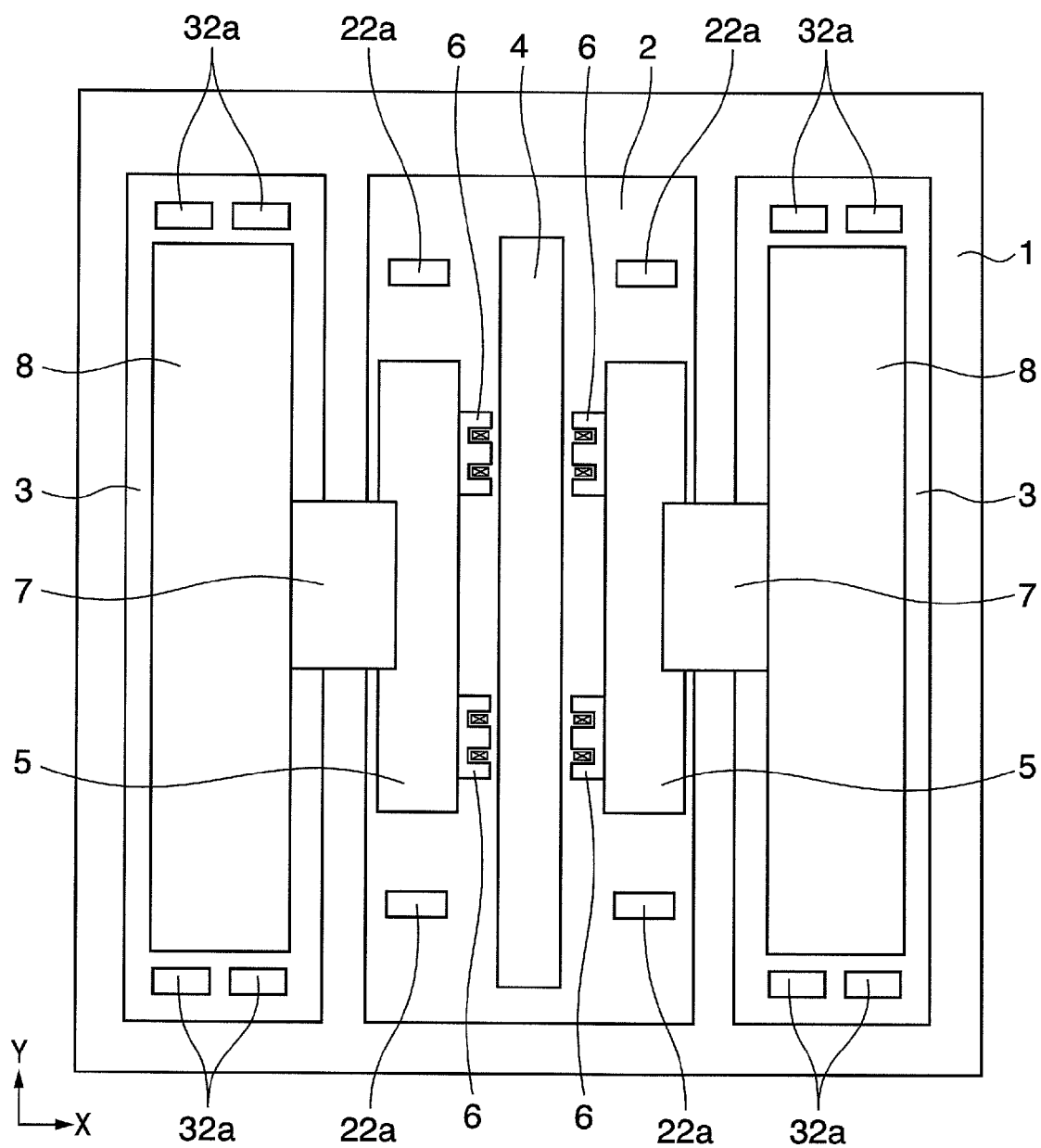
FIG. 2A is a plan view of FIG. 1, seen from below.
Figure 2B:
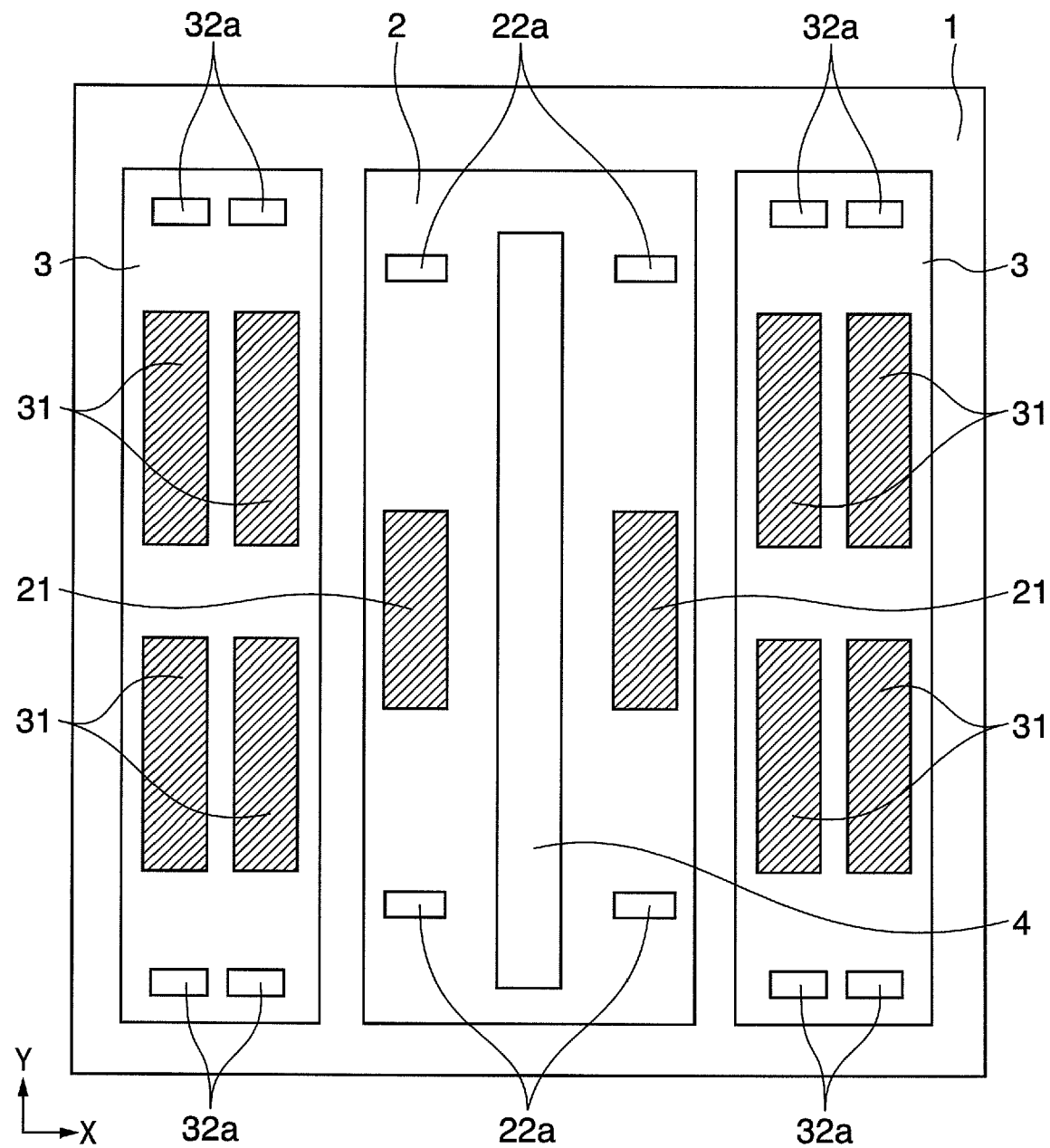
FIG. 2B is a plan view of FIG. 1, seen from below.

FIGS. 2A and 2B are plan views of FIG. 1, seen from below, in which the slider 9 is not illustrated in FIG. 2A, and FIG. 2B shows the base surface plate 1, slider surface plate 2, and Y surface plates 3. At least that surface of each Y foot 5, which opposes the slider surface plate 2, is made of a magnetic material. Static pressure fluid bearing units 21 support and guide the corresponding Y feet 5, serving as movable bodies, without making contact in the Z direction (vertical direction), with respect to the slider surface plate 2, serving as a reference structure. Each Y foot 5 is provided with E-shaped electromagnets 6, and guided without making contact in the X direction, with respect to a magnetic body plate 4 arranged at the center of the slider surface plate 2. The driving forces between the movable magnets 7 and Y stators 8 move the Y feet 5 and slider 9 integrally in the Y direction.

Similarly, at least that surface of each Y stator 8, which opposes the corresponding Y surface plate 3, is made of a magnetic material. The Y stators 8 can serve as counters that cancel a reaction force generated when the slider 9 accelerates or decelerates. Static pressure fluid bearing units 31 support and guide the corresponding Y stators 8, serving as movable bodies, in a non-contact manner, in the Z direction (vertical direction), with respect to the corresponding Y surface plates 3, serving as reference structures, to move the Y stators 8 in a direction opposite to the moving direction of the slider 9.

Figure 3A:
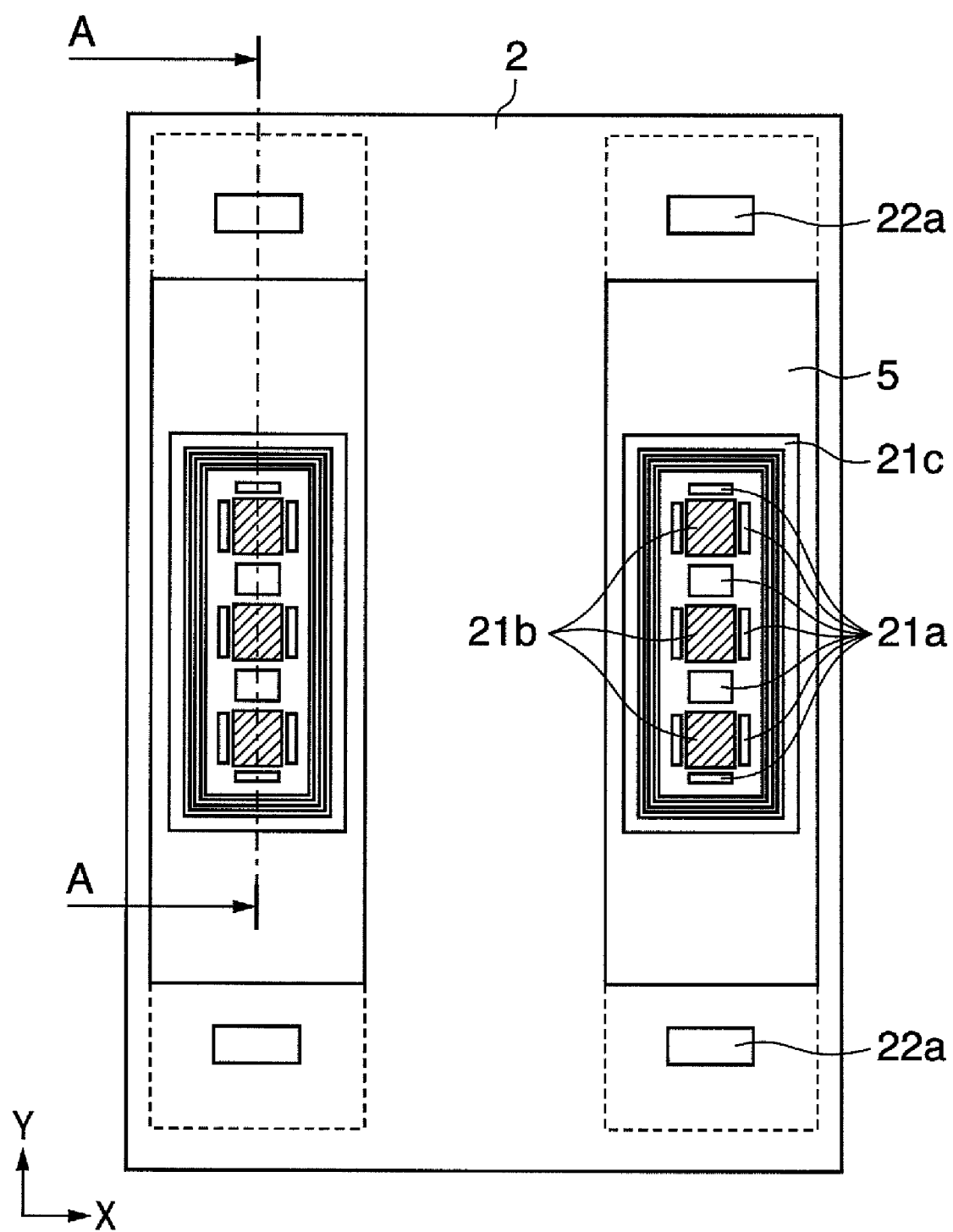
FIG. 3A is a detailed view of the Y-foot static pressure fluid bearing units, and their vicinities, shown in FIGS. 1 and 2A and 2B.
Figure 3B:
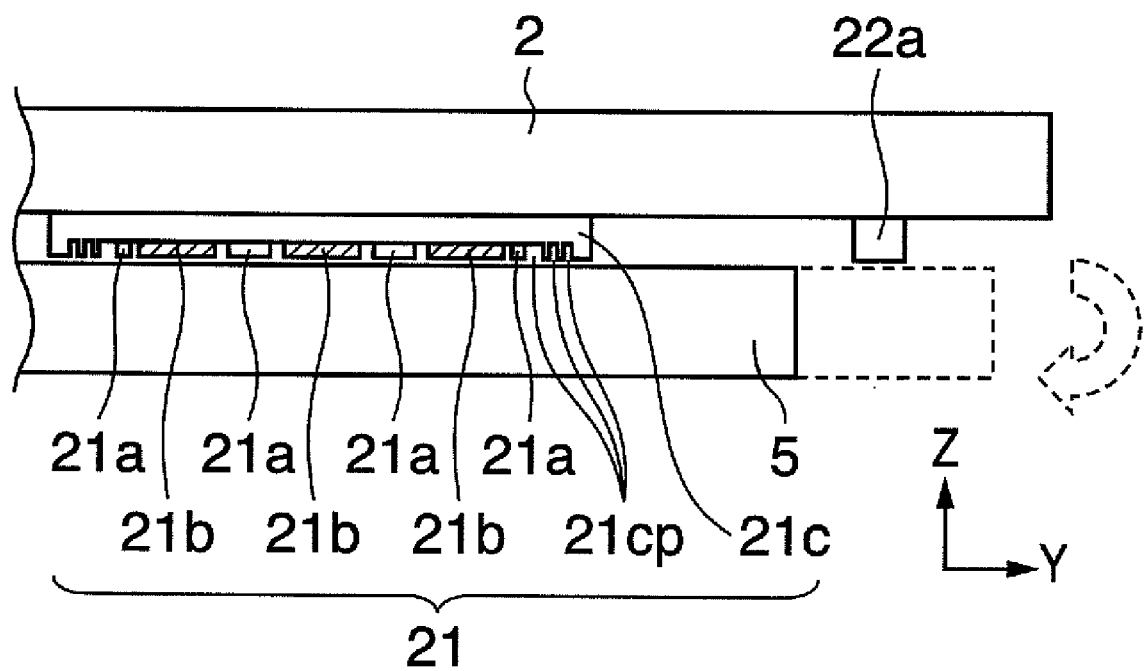
FIG. 3B is a detailed view of the Y-foot static pressure fluid bearing unit, and its vicinity, shown in FIG. 1 and FIGS. 2A and 2B.
Figure 4A:
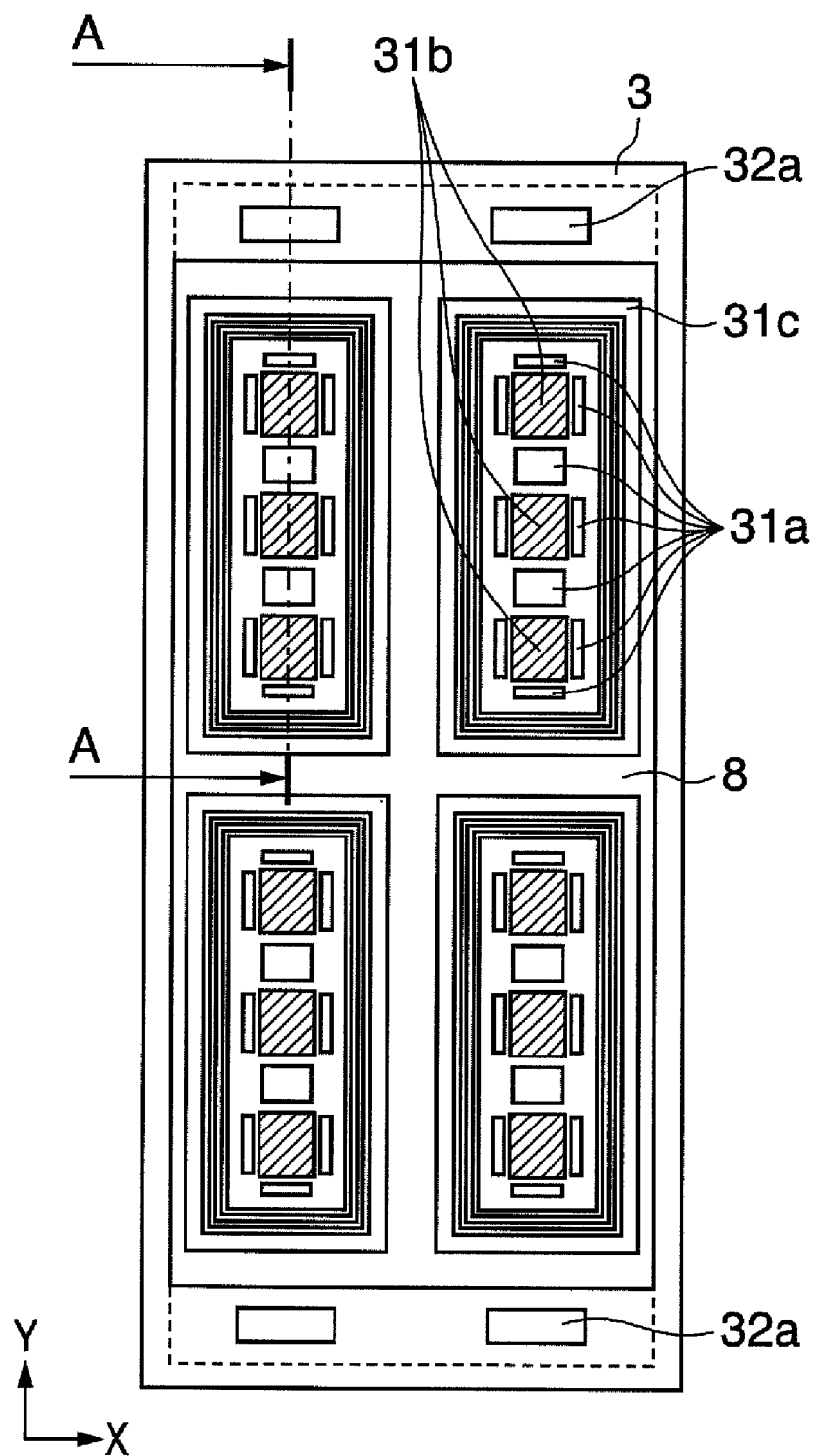
FIG. 4A is a detailed view of the static pressure fluid bearing units, and their vicinities, for a linear motor Y stator, shown in FIGS. 1 and 2A and 2B.
Figure 4B:
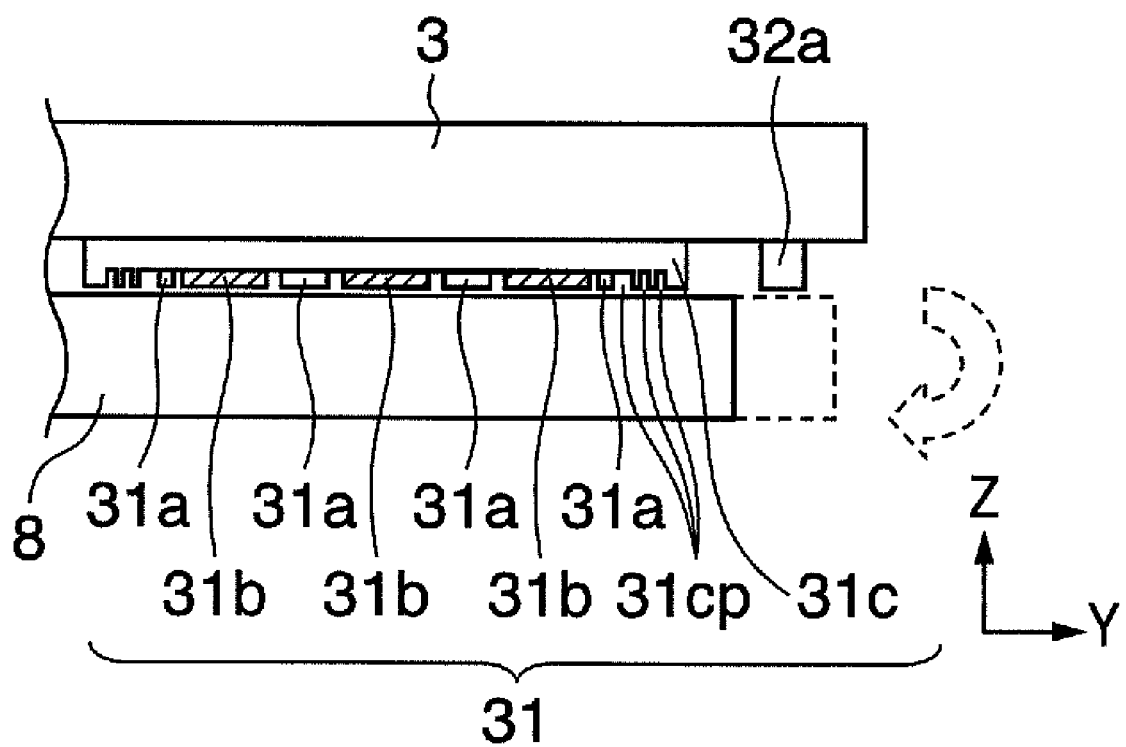
FIG. 4B is a detailed view of the static pressure fluid bearing unit, and its vicinity, for the linear motor Y stator shown in FIGS. 1 and 2A and 2B.

FIGS. 3A and 3B are views showing the static pressure fluid bearing units 21, which guide the Y feet 5, and their vicinities. FIG. 4A is a perspective view, seen from below, of the static pressure fluid bearing units 31, which guide the Y stators 8, and their vicinities. FIG. 4B is a sectional view taken along the line A-A of FIG. 4A. The static pressure fluid bearing units 21 and 31 require pipes to supply a fluid. To avoid the resistance of the pipes, the static pressure fluid bearing units 21 and 31 are provided to the stationary-side slider surface plate 2 and Y surface plates 3. Referring to FIGS. 3A and 3B, each static pressure fluid bearing unit 21 comprises preload magnet groups 21*a*, porous static pressure fluid bearings 21*b*, and a bearing holder 21*c*, and attaches to the slider surface plate 2. The preload magnet groups 21*a* are arranged to surround the corresponding static pressure fluid bearings 21*b*. Labyrinth pockets 21*cp*, which recover fluid, such as air, are formed around the preload magnet groups 21*a*, so that the reticle stage can be used in a vacuum. In this reticle stage, the Y feet 5 are guided on the backside of the slider surface plate 2. Hence, the attraction force of the preload magnet groups 21*a* is set to balance with the sum of the weights of the Y feet 5, slider 9, and the like, and the fluid pressure of air, or the like, which is injected from the static pressure fluid bearings 21*b*. Furthermore, the slider surface plate 2, serving as the reference structure, is provided with permanent magnets 22*a*, serving as moment reducing units, slightly inside the two ends of each of movable ranges, indicated by broken lines in FIG. 3A, of the Y feet 5, which are outside the portion where the static pressure fluid bearing units 21 support the corresponding Y feet 5, serving as movable elements. When the Y foot 5 moves, as indicated by a broken line in FIG. 3B, the point of action of the static pressure fluid bearing unit 21 with respect to the Y foot 5 shifts from the barycenter of the Y foot 5, to generate a moment, as indicated by a broken arrow in FIG. 3B. When the Y foot 5 moves, as indicated by the broken lines in FIG. 3B, however, the permanent magnets 22*a* exert attraction forces on portions different from the portion where the static pressure fluid bearing unit 21 supports the Y foot 5. These attraction forces suppress the moment, as indicated by the broken arrow in FIG. 3B, to maintain the attitude of the Y foot 5 to be horizontal.

Similarly, in FIGS. 4A and 4B as well, each static pressure fluid bearing unit 31 comprises preload magnet groups 31*a*, porous static pressure fluid bearings 31*b*, and a bearing holder 31*c*, and attaches to the Y surface plate 3. The preload magnet groups 31*a* are arranged to surround the corresponding static pressure fluid bearings 31*b*. Labyrinth pockets 31*cp*, which recover the fluid, are formed around the preload magnet groups 31*a*, so the fluid does not leak outside. The attraction force of the preload magnet groups 31*a* is set to balance with the sum of the weights of the Y stators 8 and the fluid pressure of air, or the like, which is injected from the static pressure fluid bearings 31*b*. Furthermore, each Y surface plate 3, serving as the reference structure, is provided with permanent magnets 32*a*, serving as moment reducing units, slightly inside the two ends of a movable range, indicated by a broken line in FIG. 4A, of the Y stator 8, which is outside the portion where the static pressure fluid bearing units 31 support the Y stator 8, serving as a movable element. When the Y stator 8 moves as indicated by a broken line in FIG. 4B, the point of action of the static pressure fluid bearing unit 31, with respect to the Y stator 8, shifts from the barycenter of the Y stator 8 to generate a moment, as indicated by a broken arrow in FIG. 4B. When the Y stator 8 moves as indicated by the broken line in FIG. 4B, however, the permanent magnets 32*a* exert attraction forces on portions different from the portion where the static pressure fluid bearing units 31 support the Y stator 8. These attraction forces suppress the moment, as indicated by the broken arrow in FIG. 4B, to maintain the attitude of the Y stator 8 to be horizontal.

Second Embodiment

Figure 5A:
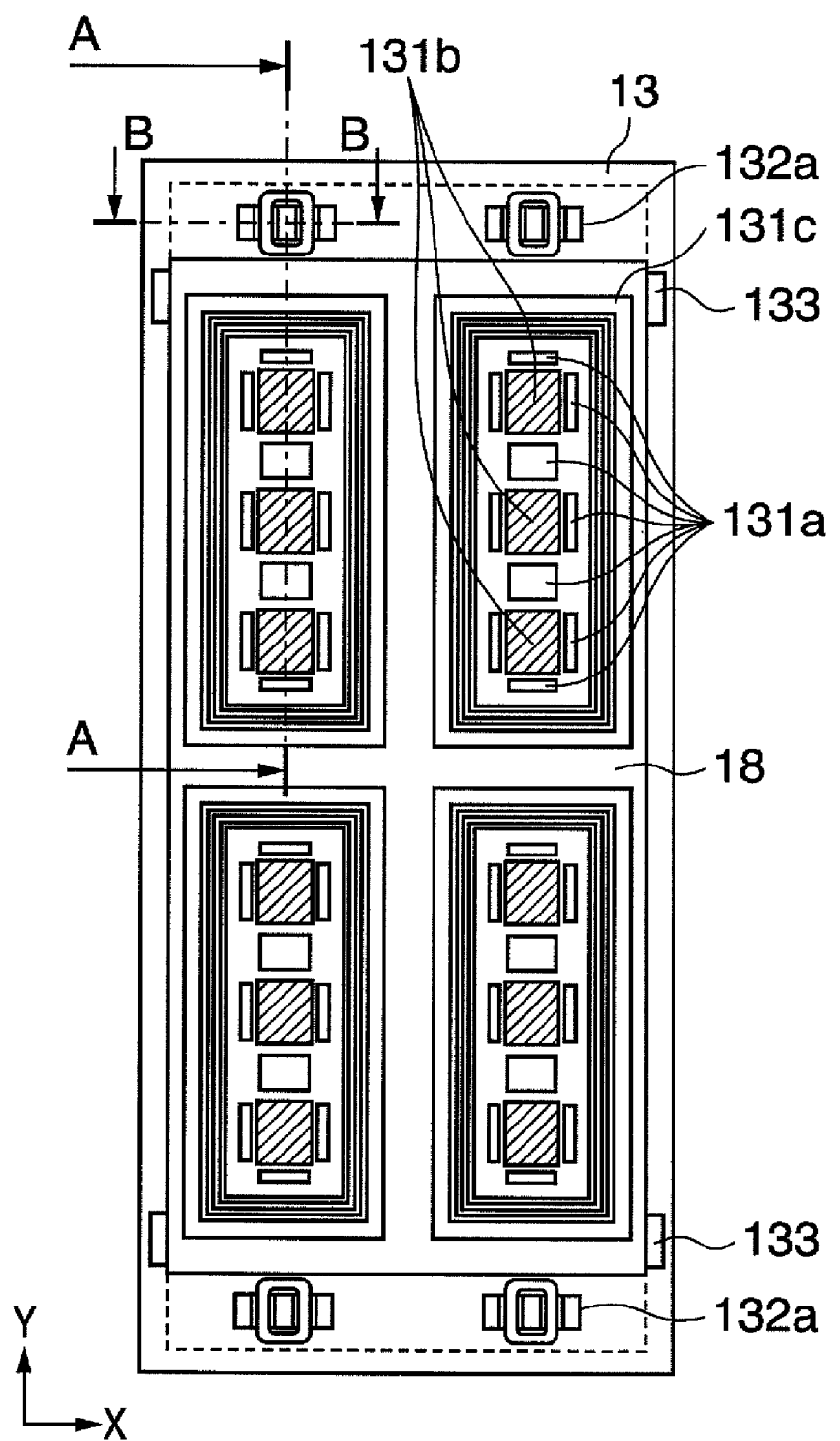
FIG. 5A is a detailed view of static pressure fluid bearing units, and their vicinities, for a linear motor Y stator in an in-vacuum reticle stage, which is to be applied to a semiconductor exposure apparatus, according to the second embodiment.
Figure 5B:
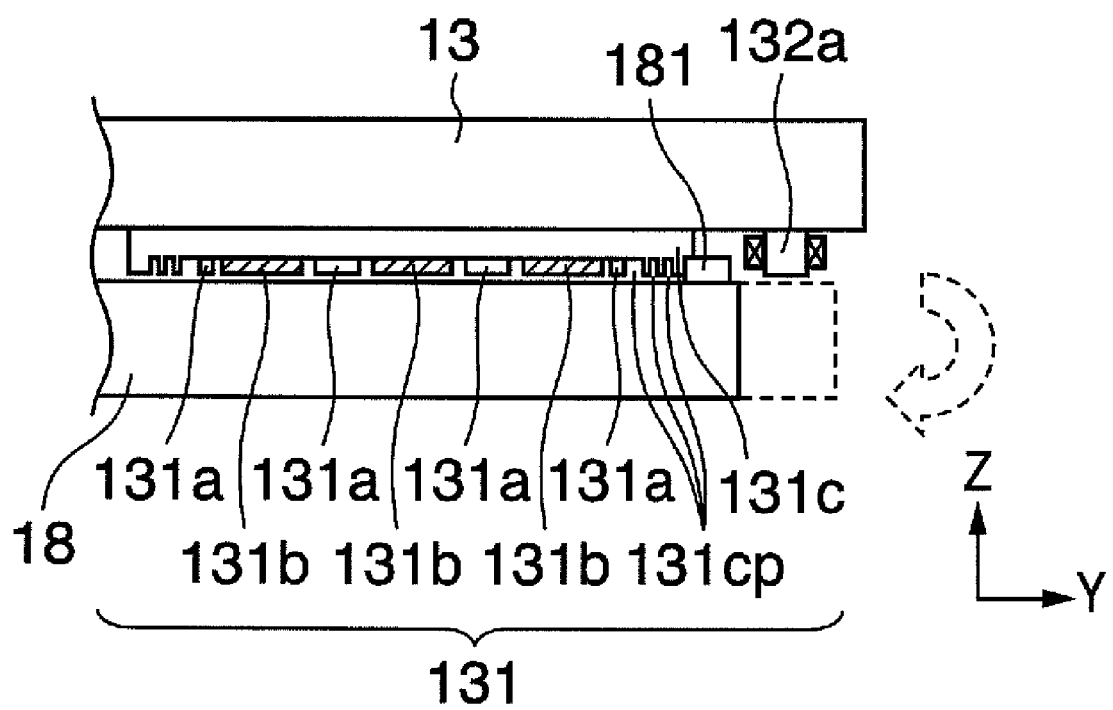
FIG. 5B is a detailed view of the static pressure fluid bearing unit, and its vicinity, for the linear motor Y stator in the in-vacuum reticle stage, which is to be applied to the semiconductor exposure apparatus according to the second embodiment.
Figure 5C:
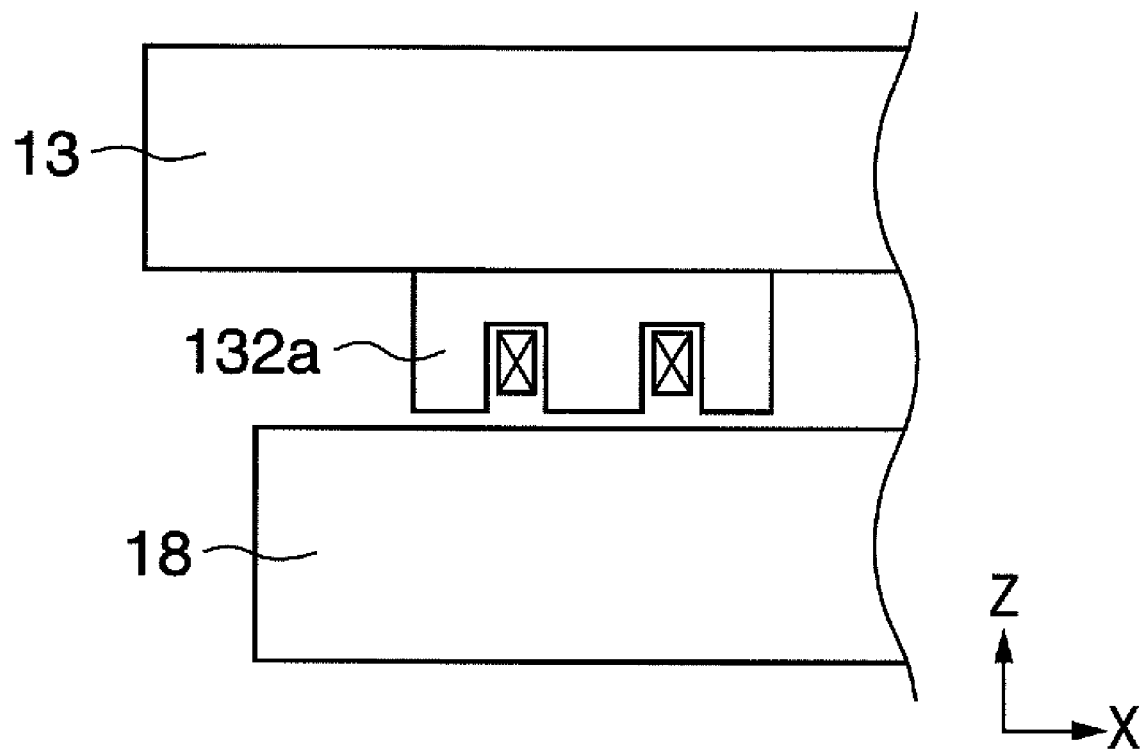
FIG. 5C is a detailed view of the static pressure fluid bearing unit, and its vicinity, for the linear motor Y stator in the in-vacuum reticle stage, which is to be applied to the semiconductor exposure apparatus according to the second embodiment.

FIG. 5A is a perspective view of static pressure fluid bearing units, and their vicinities, for a linear motor Y stator in an in-vacuum reticle stage, FIG. 5B is a sectional view taken along the line A-A of FIG. 5A, and FIG. 5C is a sectional view taken along the line B-B of FIG. 5A. The arrangement of the reticle stage is the same as that of the first embodiment in FIG. 1, and will, accordingly, be omitted. The Y feet are the same as the Y stators, and a repetitive description will be omitted. At least that surface of a linear stator Y stator 18, which opposes a Y surface plate 13, is made of a magnetic material. Referring to FIG. 5A, each static pressure fluid bearing unit 131 comprises preload magnet groups 131*a*, porous static pressure fluid bearings 131*b*, and a bearing holder 131*c*, and attaches to the Y surface plate 13. The preload magnet groups 131*a* are arranged to surround the corresponding static pressure fluid bearings 131*b*. Labyrinth pockets 131*cp*, which recover a fluid, are formed around the preload magnet groups 131*a*, so that the reticle stage can be used in a vacuum. In this reticle stage, the Y stator 18, serving as a movable element, is guided in the vertically reverse direction with respect to the Y surface plate 13, serving as a reference structure. Hence, the attraction force of the preload magnet groups 131*a* is set to balance with the sum of the weight of the Y stator 18 and the pressure of the fluid injected from the static pressure fluid bearings 131*b*. Furthermore, the Y surface plate 13 is provided with E-shaped electromagnets 132*a*, respectively having coils, slightly inside the two ends of the movable range, indicated by a broken line in FIG. 5A, of the Y stator 18, which is outside the portion where the static pressure fluid bearing units 131 support the Y stator 8. The E-shaped electromagnets 132*a* exert attraction forces on those portions of the Y stator 18, which are not supported by the static pressure fluid bearing units 131. The two ends in the longitudinal direction of the Y stator 18 are provided with gap sensors 181, which measure the gap between the Y stator 18 and the Y surface plate 13. The gap sensors 181 can measure a change in attitude that takes place when the Y stator 18 moves. When controlling the current values supplied to the coils of the E-shaped electromagnets 132*a*, i.e., the attraction forces, on the basis of outputs from the gap sensors 181, the moment, as indicated by a broken arrow in FIG. 5B, can be suppressed to maintain the attitude of the Y stator 18 to be horizontal. In the second embodiment, the E-shaped electromagnets 132*a*, which are one type of electromagnetic actuator, constitute moment reducing units.

In the second embodiment, the gap sensors 181 are used to control the driving forces of the E-shaped electromagnets 132*a*. Alternatively, position sensors, or the like, which measure the position in the moving direction, or the attitude of the Y stator 18, may be used instead. In this case, the relationship between the position of the Y stator 18 and fluctuation in gap must be measured and stored in advance.

The second embodiment describes correction of the moment, which occurs when the movable element moves to an end of its movable range. A similar means can also solve a moment, which is generated by acceleration or deceleration, or an urgent stop, of the movable element, which takes place when the barycenter in the Z direction of the movable element shifts from the position Z of the point of action of the driving force. In this case, the movable element can be placed at any position, and the driving forces of the electromagnets are controlled on the basis of the values of the gap sensors or the profile of acceleration or deceleration.

The first and second embodiments may be combined. More specifically, permanent magnets and electromagnets may be combined to correct the moment generated when the movable element moves.

Third Embodiment

FIG. 6 is a sectional view of a static pressure fluid bearing unit, and its vicinity, for a linear motor Y stator in an in-vacuum reticle stage. The arrangement of the reticle stage is the same as that of the first embodiment shown in FIG. 1. The perspective view of the static pressure fluid bearing unit, and its vicinity, is similar to that shown in FIGS. 3A and 5A of the first and second embodiments, respectively, and will not be illustrated. At least that surface of a linear stator Y stator 28, which opposes a Y surface plate 23, is made of a magnetic material. Referring to FIG. 6, a static pressure fluid bearing unit 231 comprises preload magnet groups 231*a*, porous static pressure fluid bearings 231*b*, and a bearing holder 231*c*, and attaches to the Y surface plate 23. The preload magnet groups 231*a* are arranged to surround the corresponding static pressure fluid bearings 231*b*. Labyrinth pockets 231*cp*, which recover a fluid, are formed around the preload magnet groups 231*a*, so that the reticle stage can be used in a vacuum. In this reticle stage, the Y stator 28, serving as a movable element, is guided on the backside of the Y surface plate 23, serving as a reference structure. Hence, the attraction force of the preload magnet groups 231*a* is set to balance with the sum of the weight of the Y stator 28 and the pressure of the fluid injected from the static pressure fluid bearings 231*b*. The two ends in the longitudinal direction of the Y stator 28, which are outside a portion where the static pressure fluid bearing unit 231 supports the Y stator 28, are provided with E-shaped electromagnets 282*a*, respectively having coils. The E-shaped electromagnets 282*a* can generate attraction forces, with respect to a magnetic body block 233, attached to the Y surface plate 23. Although not shown in FIG. 6, to avoid complexity, in the same manner as in the second embodiment, the ends in the longitudinal direction of the Y stator 28 are provided with gap sensors, which measure the gap between the Y stator 28 and the Y surface plate 23, or position sensors that detect the position in the moving direction of the Y stator 28. When controlling the current values supplied to the coils of the E-shaped electromagnets 282*a*, i.e., the attraction force, on the basis of the values of the gap sensors, the moment, as indicated by a broken arrow in FIG. 6, can be suppressed to maintain the attitude of the Y stator 18 to be horizontal. In this manner, any member, such as an electromagnet, the attraction forces of which can be controlled, can be provided as moment correction means, to the movable element side, to obtain the same effect.

Fourth Embodiment

Figure 7:
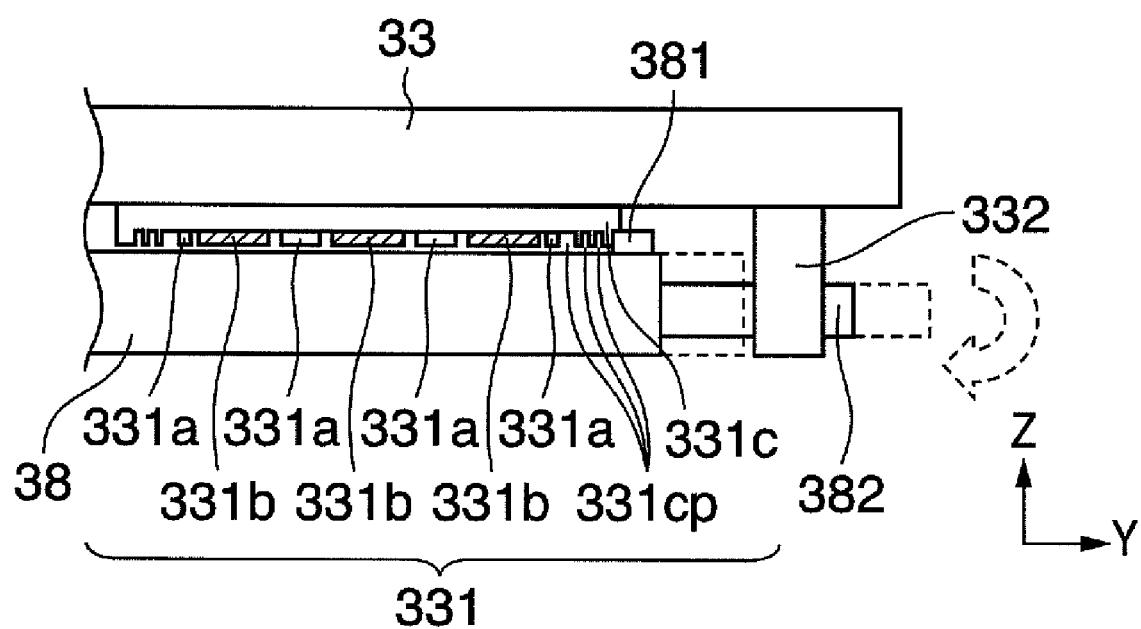
FIG. 7 is a sectional view of a static pressure fluid bearing unit, and its vicinity, for a linear motor Y stator in an in-vacuum reticle stage, which is to be applied to a semiconductor exposure apparatus according to the fourth embodiment.

FIG. 7 is a sectional view of a static pressure fluid bearing unit, and its vicinity, for a linear motor Y stator in an in-vacuum reticle stage. The arrangement of the reticle stage is the same as that of the first embodiment in FIG. 1. The perspective view of the static pressure fluid bearing unit, and its vicinity, is similar to FIGS. 3A and 5A of the first and second embodiments, respectively, and will not be illustrated. At least that surface of a linear stator Y stator 38, which opposes a Y surface plate 33, is made of a magnetic material. Referring to FIG. 7, a static pressure fluid bearing unit 331 comprises preload magnet groups 331*a*, porous static pressure fluid bearings 331*b*, and a bearing holder 331*c*, and attaches to the Y surface plate 33. The preload magnet groups 331*a* are arranged to surround the corresponding static pressure fluid bearings 331*b*. Labyrinth pockets 331*cp*, which recover a fluid, are formed around the preload magnet groups 331*a*, so that the reticle stage can be used in a vacuum. In this reticle stage, the Y stator 38, serving as a movable element, is guided on the backside of the Y surface plate 33, serving as a reference structure. Hence, the attraction force of the preload magnet groups 331*a* is set to balance with the sum of the weight of the Y stator 38 and the pressure of the fluid injected from the static pressure fluid bearings 331*b*. The two ends in the longitudinal direction of the Y surface plate 33Y, which are outside a portion where the static pressure fluid bearing unit 331 supports the Y stator 38, are provided with Z linear motor stators 332, respectively having coils. The two ends in the longitudinal direction of the Y stator 38, which are outside a portion where the static pressure fluid bearing unit 331 supports the Y stator 38, are provided with Z movable magnets 382. The Z linear motor stators 332 and Z movable magnets 382 can generate driving forces in the Z direction. The ends in the longitudinal direction of the Y stator 38 are provided with gap sensors, which measure the gap between the Y stator 38 and Y surface plate 33, or sensors 381, which detect the position in the moving direction of the Y stator 38. When controlling the current values supplied to the coils of the Z linear motor stators 332, i.e., the Z driving forces, on the basis of the values of the sensors 381, the moment, as indicated by a broken arrow in FIG. 7, can be suppressed to maintain the attitude of the Y stator 38 to be horizontal. In this embodiment, the Z linear motors, as one type of electromagnetic actuator, constitute moment reducing units.

In the fourth embodiment, the Z stators 332, which constitute the moment reducing units, are provided to the Y surface plate 33, and the Z movable magnets 382 are provided to the Y stator 38. Alternatively, the Z stators 332 may be provided to the Y stator 38, and the Z movable magnets 382 may be provided to the Y surface plate 33.

Fifth Embodiment

Figure 8:
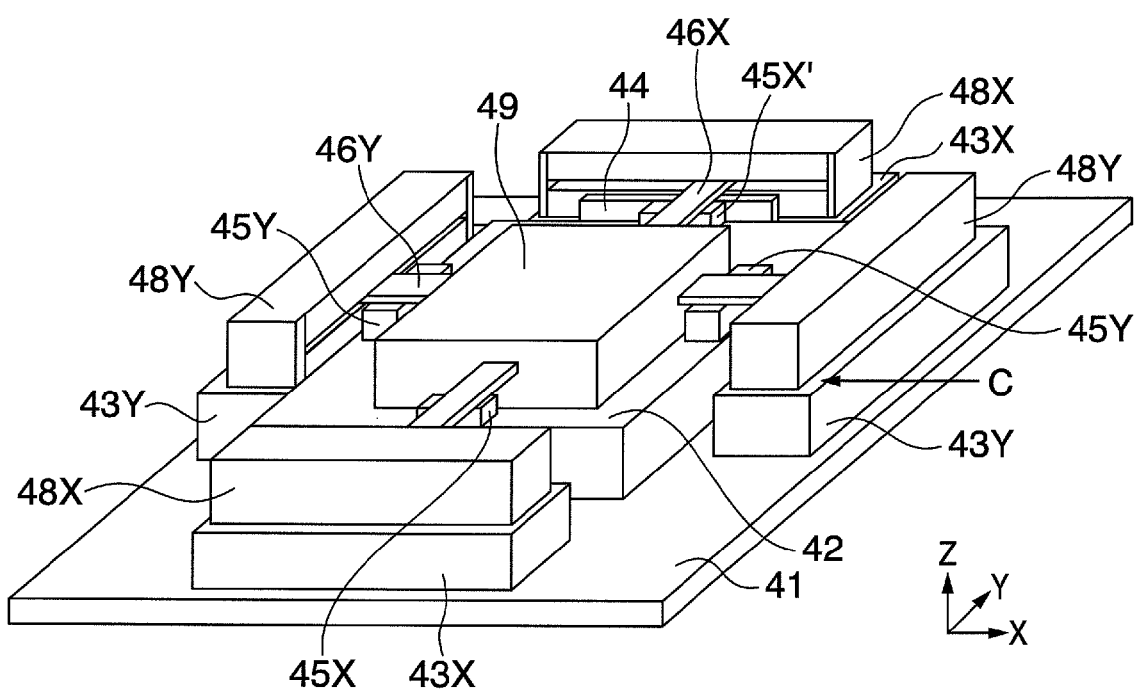
FIG. 8 is a schematic perspective view of an in-vacuum wafer stage, which is to be applied to a semiconductor exposure apparatus according to the fifth embodiment.

FIG. 8 is a schematic perspective view of an in-vacuum wafer stage. According to this embodiment, a slider surface plate 42 is mounted at the central portion of a base surface plate 41. X surface plates 43X, on which linear motor X stators 48X, which drive an X beam 46X in the Z direction, are mounted, and Y surface plates 43Y, on which linear motor Y stators 48Y, which drive a Y beam 46Y in the Y direction, are mounted, are mounted around the slider surface plate 42. An X foot 45X and X foot 45X' attach to the two ends of the X beam 46X, and Y feet 45Y attach to the two ends of the Y beam 46Y. Static pressure fluid bearing units (not shown) support and guide the X feet 45X and 45X', and the Y feet 45Y, serving as movable elements, in the Z direction (vertical direction), with respect to the slider surface plate 42, serving as a reference structure. The portion where the X beam 46X and Y beam 46Y intersect is provided with a slider 49. A static pressure fluid bearing unit supports and guides the slider 49 in the Z direction (vertical direction), with respect to the slider surface plate 42. A magnetic body plate 44 attaches to the slider surface plate 42. A static pressure fluid bearing unit (not shown) supports and guides the side surfaces of the X foot 45X' in the Y direction, with respect to the magnetic body plate 44. Furthermore, the X beam 46X, Y beam 46Y, and slider 49 are also supported in a non-contact manner (not shown). As the beams 46X and 46Y are driven, the slider 49 can smoothly move on the upper surface of the slider surface plate 42 in the X-Y direction. A six-axis fine moving stage (not shown) is placed on the slider 49, and a wafer chuck is arranged on the six-axis fine moving stage, thus constituting a wafer stage. The X stators 48X and Y stators 48Y, serving as actuators, which drive the stage, have a function as counters that cancel the reaction forces generated when the slider 49 accelerates or decelerates. Static pressure fluid bearing units support and guide the X stators 48X, and the Y stators 48Y, serving as movable elements, in the Z direction (vertical direction) in a non-contact manner, with respect to the X surface plates 43X, and the Y surface plates 43Y, serving as reference structures, respectively, to move in the direction opposite to the moving direction of the slider 49. At least those surface of the X stators 48X and Y stators 48Y, which respectively oppose the X surface plates 43X and Y surface plates 43Y, are made of a magnetic material.

Figure 9:
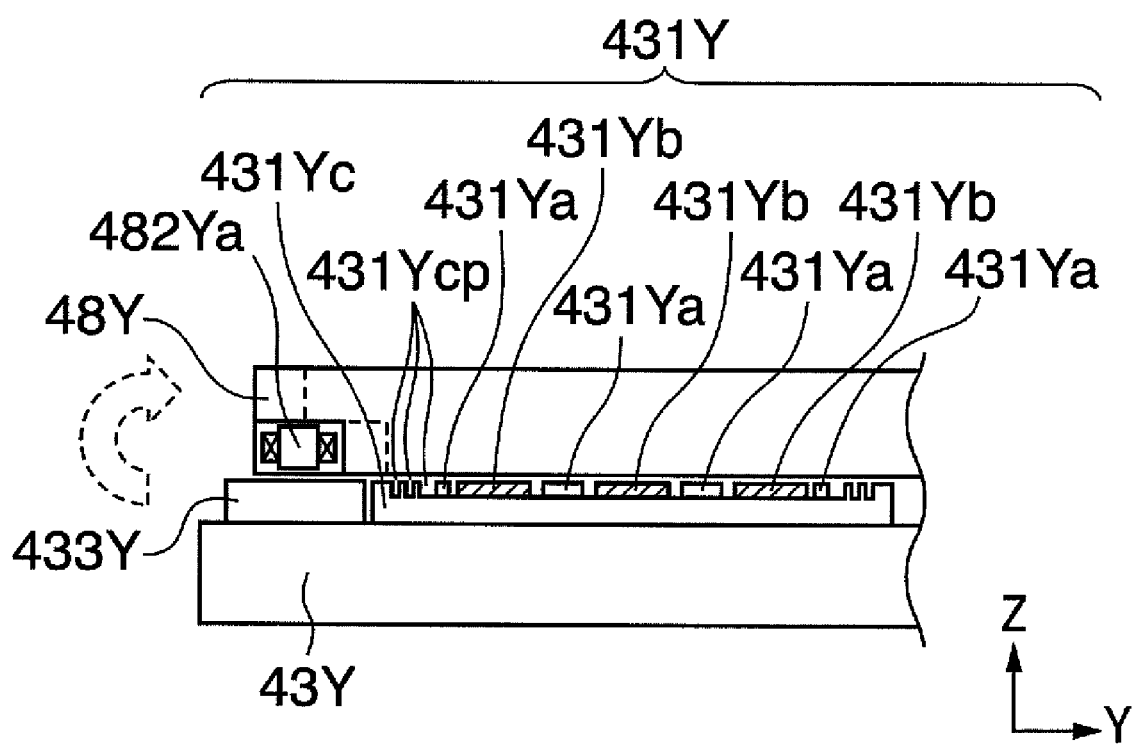
FIG. 9 is a sectional view, taken along the arrow of a direction C, of the static pressure fluid bearing unit, and its vicinity, for the linear motor Y stator shown in FIG. 8.
Figure 10A:
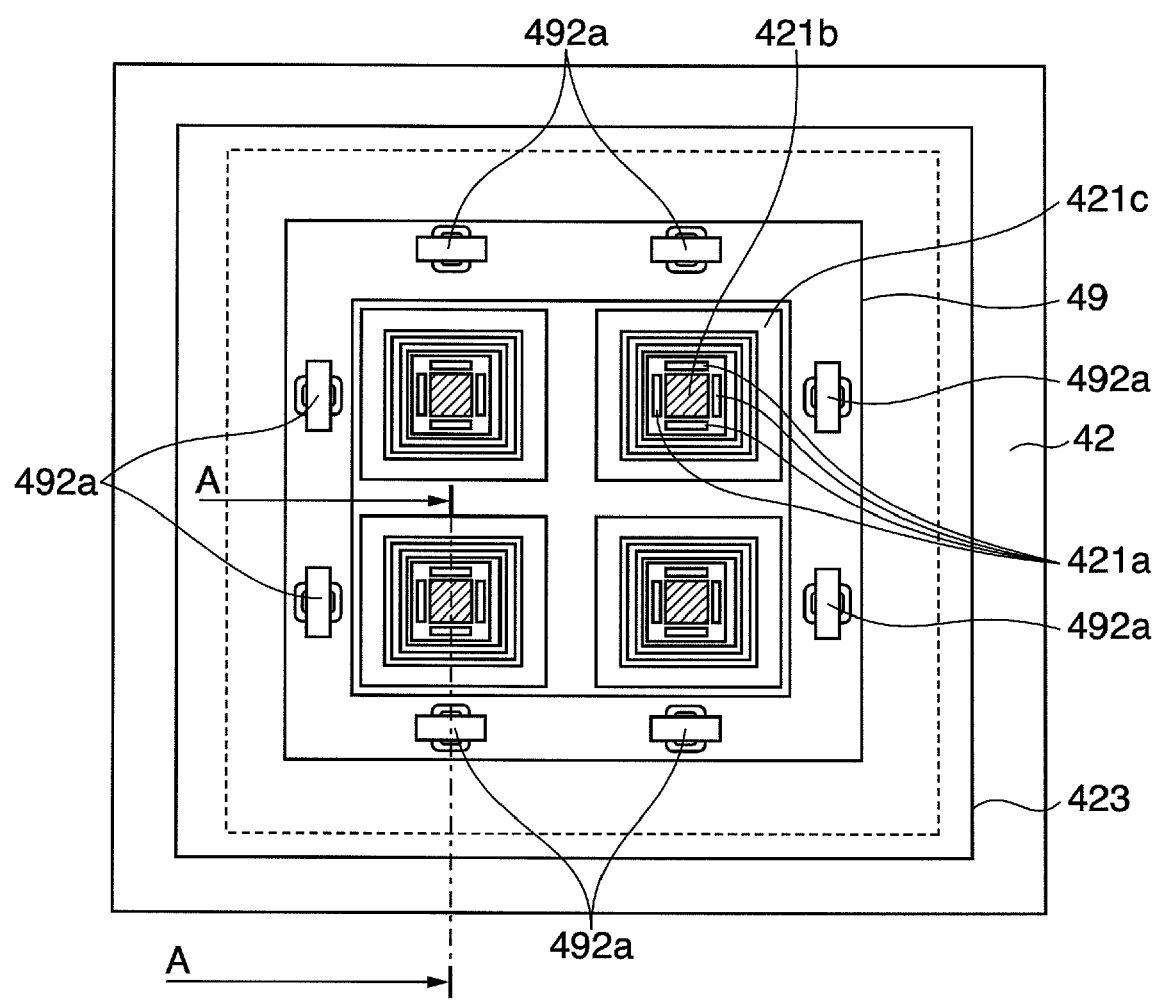
FIG. 10A is a detailed view of the static pressure fluid bearing unit, and its vicinity, for the slider shown in FIG. 8.
Figure 10B:
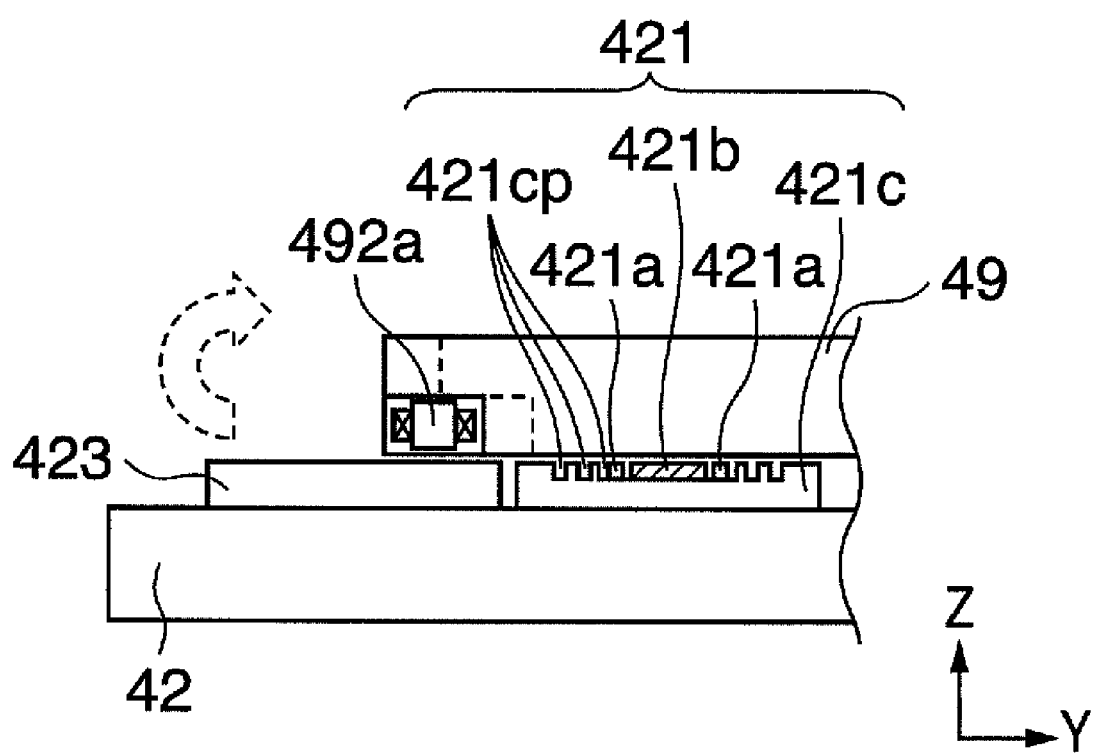
FIG. 10B is a detailed view of the static pressure fluid bearing unit, and its vicinity, for the slider shown in FIG. 8.

FIG. 9 and FIGS. 10A and 10B are detailed views of the static pressure fluid bearing units and their vicinities. As the static pressure fluid bearing units for the X stators 48X and Y stators 48Y have the same arrangement, in FIG. 9, a description will be made with reference to a sectional view seen from an arrow C shown in FIG. 8.

Referring to FIG. 9, a static pressure fluid bearing unit 431Y comprises preload magnet groups 431Ya, porous static pressure fluid bearings 431Yb, and a bearing holder 431Yc, and attaches to the Y surface plate 43Y. The preload magnet groups 431Ya are arranged to surround the corresponding static pressure fluid bearings 431Yb. Labyrinth pockets 431Ycp, which recover a fluid, are formed around the preload magnet groups 431Ya, so the wafer stage can be used in a vacuum. In this wafer stage, the Y stator 48 is guided on the topside of the Y surface plate 43. Hence, the sum of the attraction force of the preload magnet groups 431Ya and the weight of the Y stator 48 is set to balance with the pressure of the fluid injected from the static pressure fluid bearings 431Yb. The two ends in the longitudinal direction of the Y stator 48Y, which are outside a portion where the static pressure fluid bearing unit 431Y supports the Y stator 48, are provided with E-shaped electromagnets 482Ya, respectively having coils. The E-shaped electromagnets 482Ya can generate attraction forces, with respect to a magnetic body block 433Y, attaching to the Y surface plate 43. Although not shown in FIG. 8, to avoid complexity, the ends in the longitudinal direction of the Y stator 48Y are provided with gap sensors, which measure the gap between the Y stator 48Y and Y surface plate 43Y, or position sensors, which detect the position in the moving direction of the Y stator 48Y. When controlling the current values supplied to the coils of the E-shaped electromagnets 482Ya, i.e., the attraction forces, on the basis of the values of the sensors, the moment, as indicated by a broken arrow in FIG. 9, can be suppressed to maintain the attitude of the Y stator 48Y to be horizontal. When the Y stators 48Y are guided on the topside of the Y surface plate 43Y, as in this stage, an electromagnet opposite to the moving direction of the Y stators 48Y, as indicated by a broken line in FIG. 9, is driven to generate an attraction force, thus suppressing the moment.

FIGS. 10A and 10B will now be described. FIG. 10A is a perspective view seen from above the central portion of FIG. 8, and FIG. 10B is a sectional view taken along the line A-A of FIG. 10A. A broken line in FIG. 10A indicates the moving range of the slider 49. Referring to FIG. 10A, a static pressure fluid bearing unit 421 comprises preload magnet groups 421a, a porous static pressure fluid bearings 421b, and a bearing holder 421c, and attaches to the slider surface plate 42. The preload magnet groups 421a are arranged to surround the static pressure fluid bearing 421b. Labyrinth pockets 421cp, which recover a fluid, are formed around the preload magnet groups 421a, so the wafer stage can be used in a vacuum. The sum, of the attraction force of the preload magnet groups 421a and the weight of the slider 49, is set to balance with the pressure of the fluid, such as air injected from the static pressure fluid bearings 421b. The four ends of the slider surface plate 42, which are outside a portion where the static pressure fluid bearing unit 421 supports the slider 49, are provided with E-shaped electromagnets 492a, respectively having coils. The E-shaped electromagnets 492a can generate attraction forces, with respect to a magnetic body block 423, attaching to the slider surface plate 42. Although not shown in FIG. 10A, to avoid complexity, the four ends of the slider 49 are provided with gap sensors, which measure the gap between the slider 49 and the slider surface plate 42, or position sensors, which detect the position of the slider 49. When controlling the current values supplied to the coils of the E-shaped electromagnets 492a, i.e., the attraction forces, on the basis of the values of the sensors, the moment, as indicated by a broken arrow in FIG. 10B, can be suppressed, to maintain the attitude of the slider 49 to be horizontal. When the slider 49 is guided in the vertically positive direction, the electromagnet opposite to the moving direction of the slider 49, as indicated by the broken line in FIG. 10B, is driven to generate an attraction force, thus suppressing the moment.

In the first to fifth embodiments, the bearings are static pressure fluid bearings. However, the present invention is not limited to this, but can be applied to a case wherein, e.g., rolling bearings are provided to a surface plate, i.e., a reference structure.

Sixth Embodiment

Figure 11:
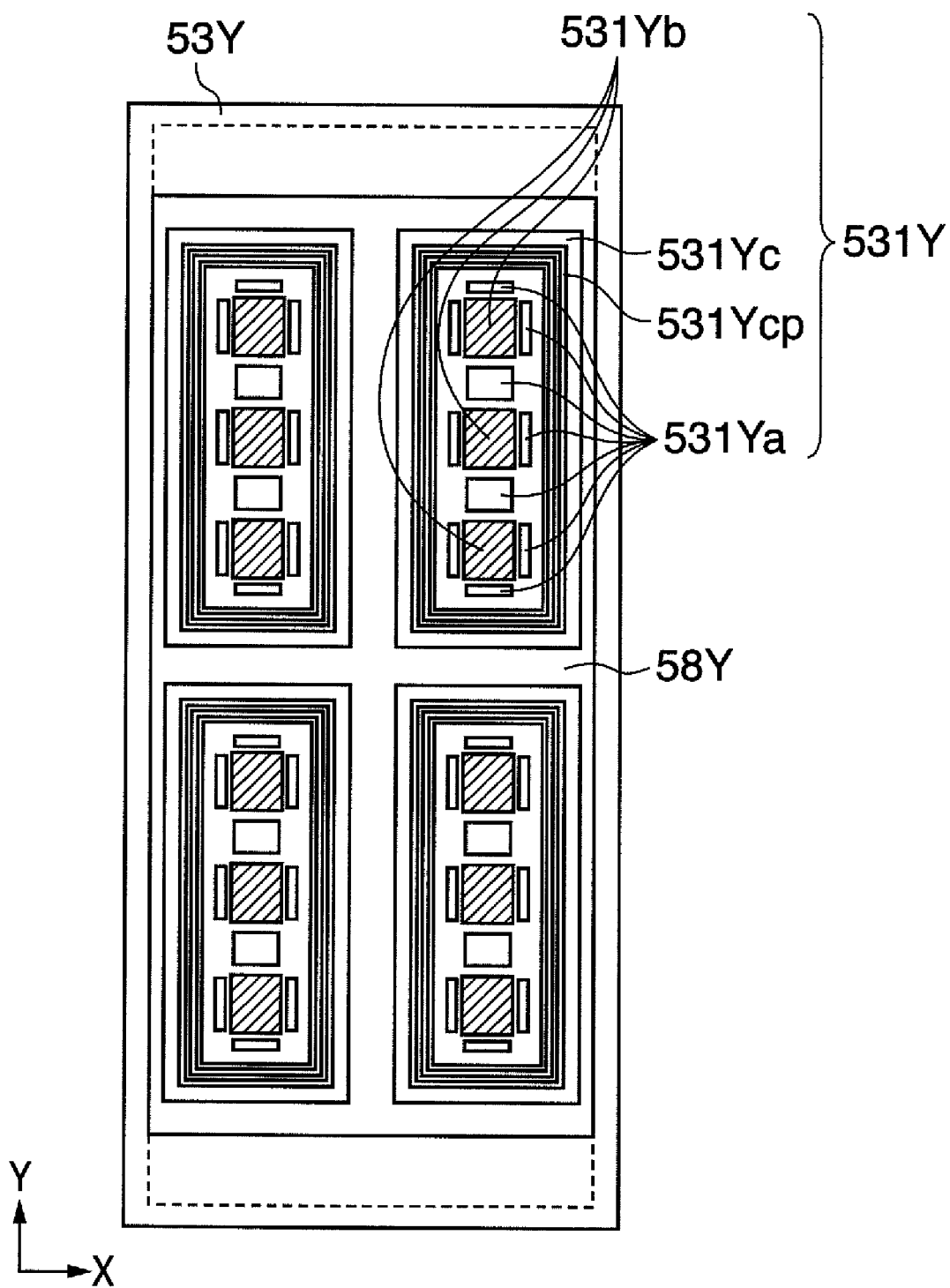
FIG. 11 is a perspective view, seen from above, of static pressure fluid bearing units, and their vicinities, for a linear motor Y stator in an in-vacuum wafer stage, which is to be applied to a semiconductor exposure apparatus according to the sixth embodiment.
Figure 12:
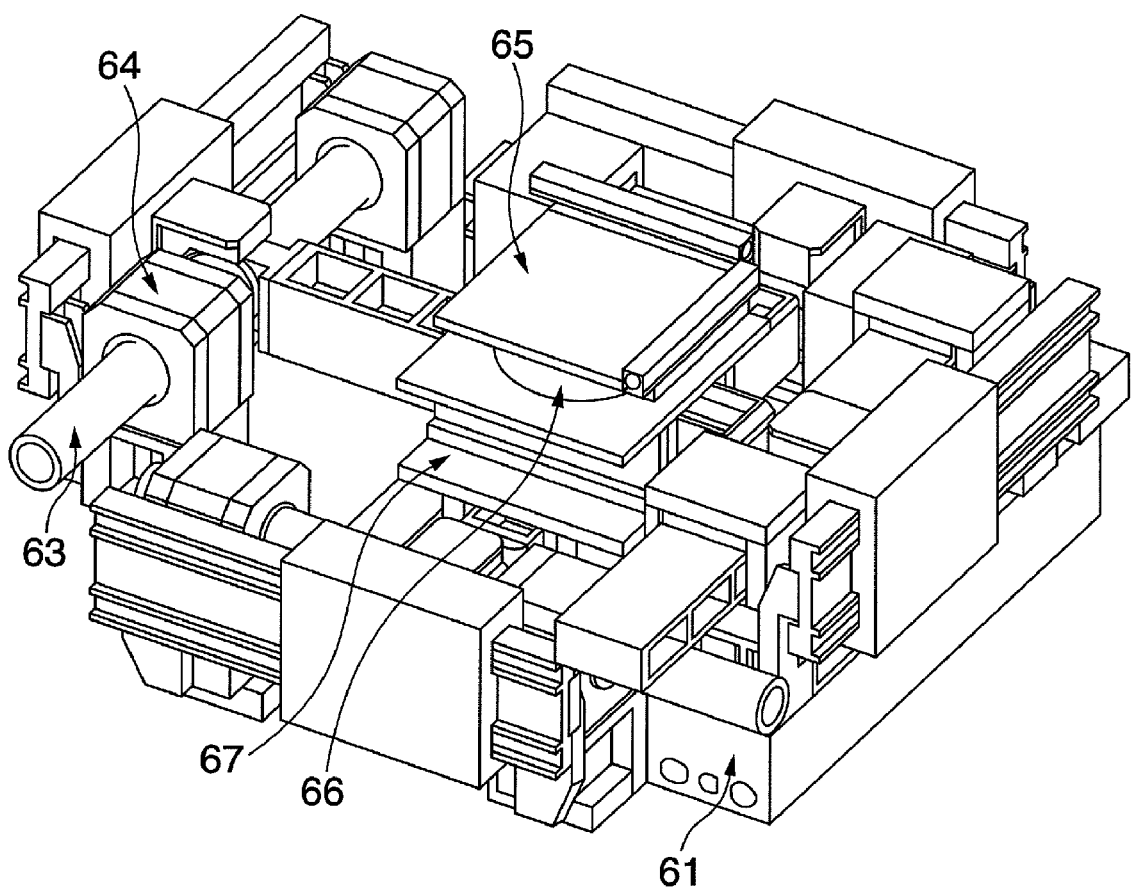
FIG. 12 is a schematic perspective view of a conventional in-vacuum wafer stage.
Figure 13:
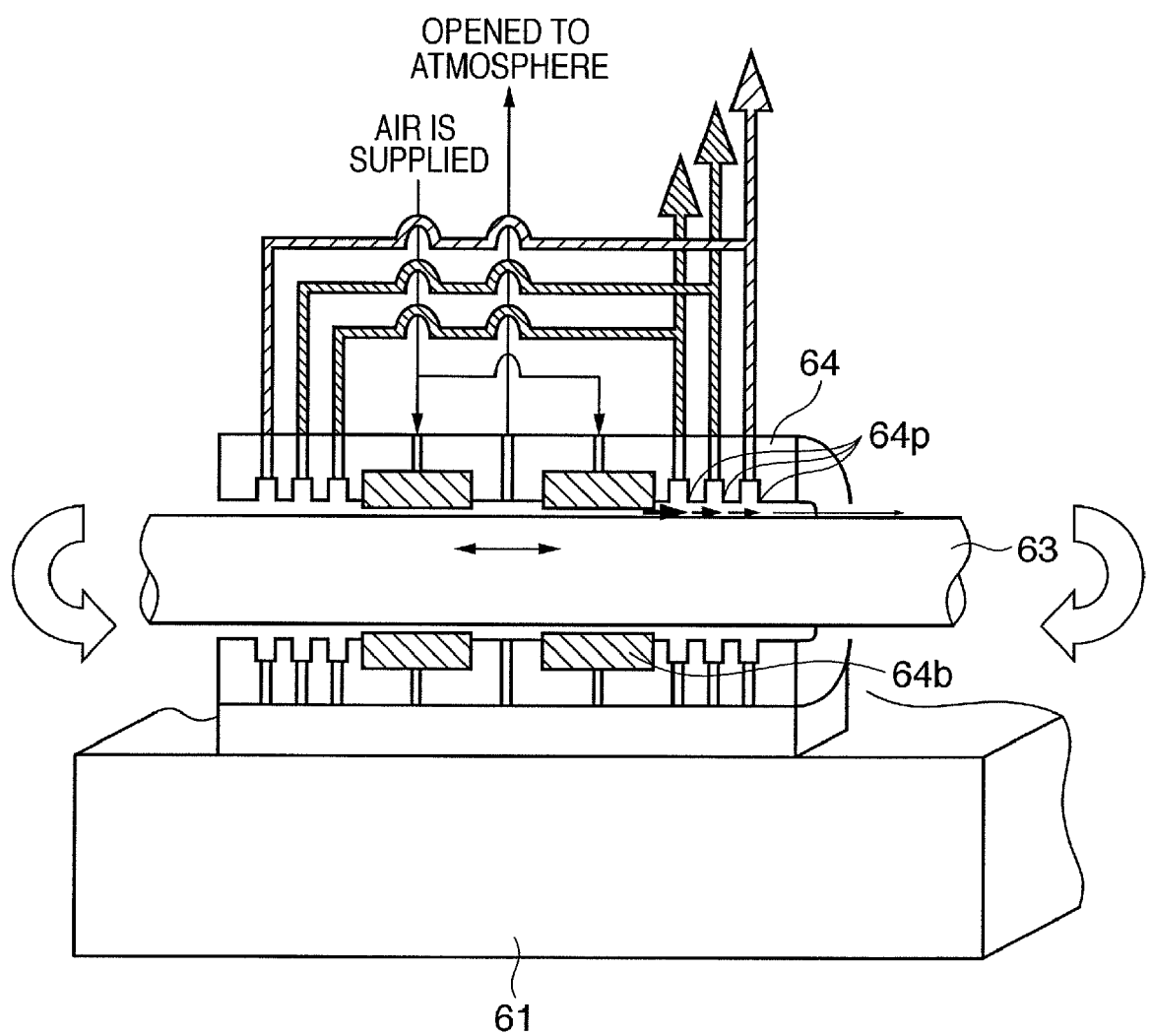
FIG. 13 is a sectional view of the static pressure fluid bearing, and its vicinity, shown in FIG. 12.

FIG. 11 is a view of static pressure fluid bearing units, and their vicinities, for an in-vacuum wafer stage according to the sixth embodiment of the present invention. The arrangement of the wafer stage is the same as that of the fifth embodiment shown in FIG. 8, and, accordingly, will not be illustrated. This embodiment will be described with reference to FIG. 11, which is a perspective view, seen from above, of a Y-direction linear motor portion. Referring to FIG. 11, a static pressure fluid bearing unit 531Y comprises preload magnet groups 531Ya, porous static pressure fluid bearings 531Yb, and a bearing holder 531Yc, and attaches to a Y surface plate 53Y. The preload magnet groups 531Ya are arranged to surround the corresponding static pressure fluid bearings 531Yb. Labyrinth pockets 531Ycp, which recover a fluid, are formed around the preload magnet groups 531Ya, so the wafer stage can be used in a vacuum. The sum of the attraction force of the preload magnet groups 531Ya and the weight of the Y stator 58Y is set to balance with the pressure of the fluid, such as air, injected from the static pressure fluid bearings 531Yb. According to this embodiment, the individual static pressure fluid bearings 531Yb are respectively provided with fluid supply pipes, so the fluid pressures of the plurality of static pressure fluid bearings 531Yb can be controlled separately. This can suppress the moment generated in the Y stator 58Y.

Although all the positioning apparatuses described above are to be used in a vacuum, the present invention can also be applied to a positioning apparatus to be used in the atmosphere. In this case, labyrinth pockets, which recover the fluid, are unnecessary.

Although the attraction means provided around the bearings are preload magnet groups, the present invention is not limited to this, but vacuum attraction may be employed instead.

(Embodiment of an Exposure Apparatus)

Figure 14:
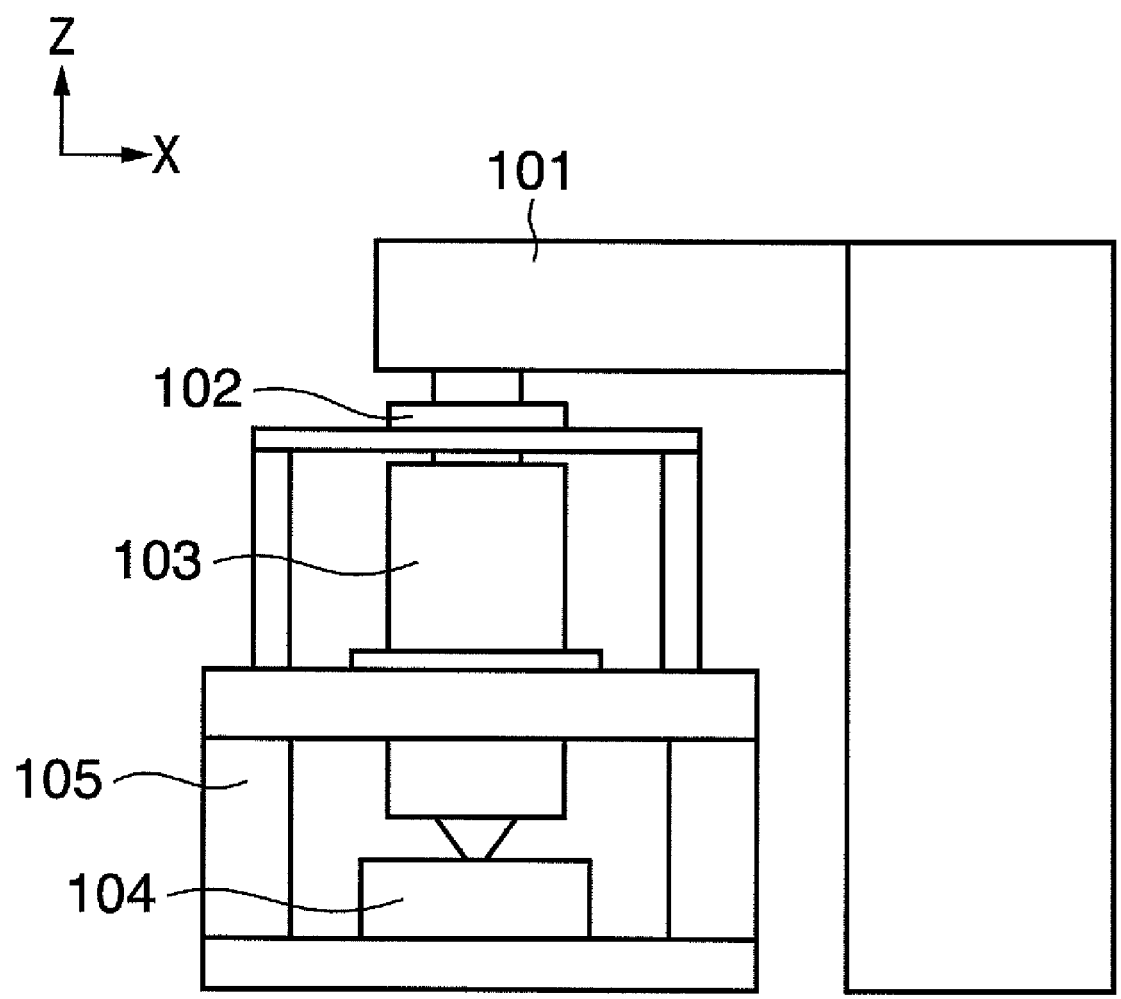
FIG. 14 is a view for explaining an exposure apparatus.

An example of an exposure apparatus to which a supporting apparatus, according to the present invention is to be applied, will be described. As shown in FIG. 14, an exposure apparatus 105 has an illumination apparatus 101, a reticle stage 102, on which a reticle is mounted, a projection optical system 103, and a wafer stage 104, on which a wafer is mounted. The exposure apparatus 105 serves to expose a circuit pattern formed on the reticle onto the wafer, and may employ a step and repeat projection exposure method or a step and scan projection exposure method.

The illumination apparatus 101 illuminates the reticle having a circuit pattern, and has a light source portion and an illumination optical system. The light source portion uses, e.g., a laser as a light source. As the laser, for example, an ArF excimer laser with a wavelength of about 193 nm, a KrF excimer laser with a wavelength of about 248 nm, or an $F_2$ excimer laser, with a wavelength of about 153 nm, can be used. The type of laser is not limited to an excimer laser. For example, a YAG laser may be used, and the number of lasers is not limited. When a laser is used as the light source, it is preferable to use a beam shaping optical system, which shapes a parallel beam from the laser light source to have a desired beam shape, or an incoherent optical system, which changes a coherent laser beam into an incoherent laser beam. The light source that can be used in the light source portion is not limited to a laser, but one or a plurality of lamps, such as mercury lamps or xenon lamps, may be used.

The illumination optical system is an optical system that illuminates a mask, and includes a lens, a mirror, a light integrator, a stop, and the like.

As the projection optical system 103, an optical system comprising only a plurality of lens elements, an optical system having a plurality of lens elements and a concave mirror, an optical system having a plurality of lens elements and a diffraction optical element, such as a kinoform, an optical system in which all optical elements comprise mirrors, or the like, can be used.

For example, a linear motor can move the reticle stage 102 and wafer stage 104. In the case of the step and scan projection optical method, the respective stages move in a sync manner. To align the pattern of the reticle with the wafer, at least one of the wafer stage and reticle stage is additionally provided with an actuator.

Such an exposure apparatus can be used in the manufacture of a semiconductor device, such as a semiconductor integrated circuit, or a device, such as a micromachine or thin film magnetic head having a fine pattern.

(Embodiment of Device Manufacture)

Figure 15:
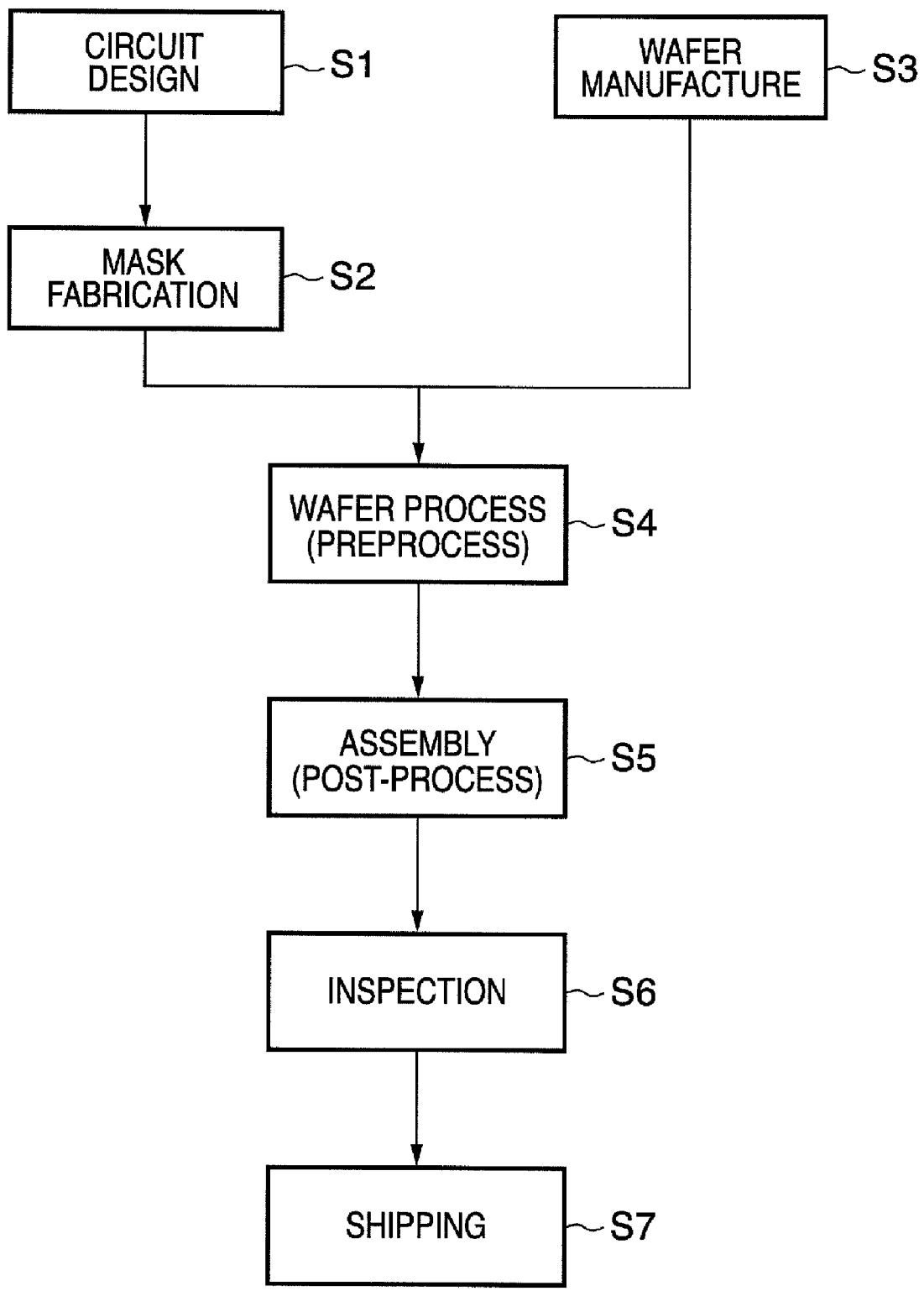
FIG. 15 is a flowchart for explaining device manufacture, which uses an exposure apparatus.

An embodiment of a device manufacturing method, which uses the exposure apparatus described above, will be described, with reference to FIGS. 15 and 16. FIG. 15 is a flowchart to explain the manufacture of a device (e.g., a semiconductor chip, such as an IC or an LSI, an LCD, a CCD, or the like). A description will be made by taking a semiconductor chip manufacturing method as an example.

In step 51 (circuit design), the circuit of a semiconductor device is designed. In step S2 (mask fabrication), a mask is fabricated on the basis of the designed circuit pattern. In step S3 (wafer manufacture), a wafer is manufactured using a material such as silicon. In step 4 (wafer process), called a preprocess, the above exposure apparatus forms an actual circuit on the wafer in accordance with lithography using the mask and wafer. In step S5 (assembly), called a post-process, a semiconductor chip is formed from the wafer fabricated in step S4. This step includes processes such as assembling (dicing and bonding) and packaging (chip encapsulation). In step 6 (inspection), inspections, such as an operation check test and a durability test, of the semiconductor device fabricated in step S5 are performed. A semiconductor device is finished with these steps and shipped (step S7).

Figure 16:
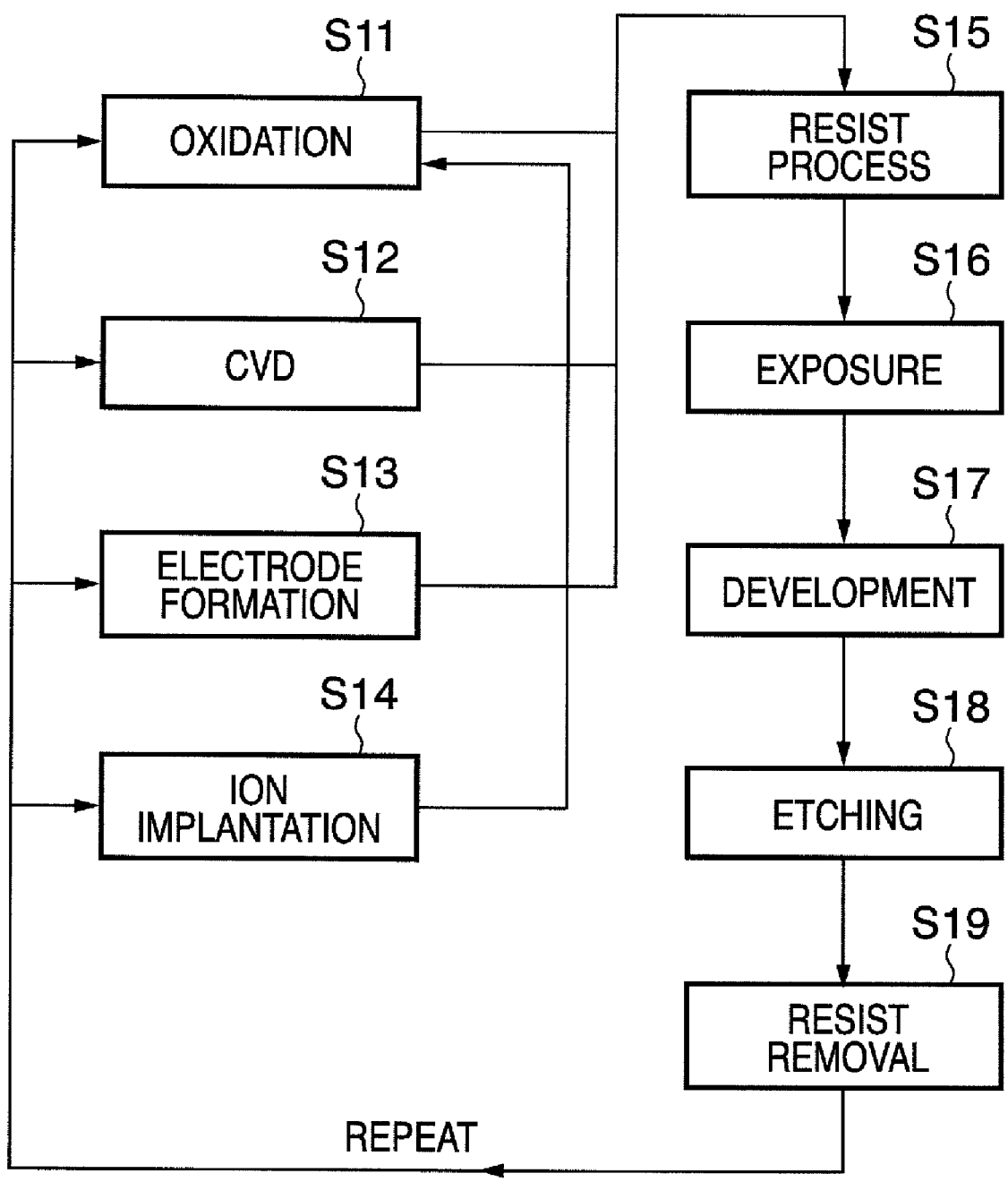
FIG. 16 is a detailed flowchart of the wafer process of step 4 of the flowchart shown in FIG. 15.

FIG. 16 is a detailed flowchart of the wafer process of step S4 shown in FIG. 15. In step S11 (oxidation), the surface of the wafer is oxidized. In step S12 (CVD), an insulating film is formed on the wafer surface. In step S13 (electrode formation), an electrode is formed on the wafer by deposition. In step S14 (ion implantation), ions are implanted into the wafer. In step S15 (resist process), a photosensitive agent is applied to the wafer. In step S16 (exposure), the exposure apparatus exposes the circuit pattern of the mask onto the wafer. In step S17 (development), the exposed wafer is developed. In step S18 (etching), portions other than the developed resist image are etched. In step S19 (resist removal), any unnecessary resist remaining after etching is removed. By repeating these steps, a multilayered structure of circuit patterns is formed on the wafer.

While the present invention has been described with reference to exemplary embodiments, it is to be understood that the invention is not limited to the disclosed exemplary embodiments. The scope of the following claims is to be accorded the broadest interpretation, so as to encompass all such modifications and equivalent structures and functions.

What is claimed is:

1. A supporting apparatus for supporting a movable element, comprising:
    a bearing unit which supports said movable element; and
    a moment reducing unit which exerts a force on a position of said movable element which is different from a position supported by said bearing unit so as to reduce a moment that acts on said movable element when the position of said movable element which is supported by said bearing unit changes as said movable element moves.

2. The apparatus according to claim 1, wherein an element of the moment which acts on said movable element includes a weight of said movable element.

3. The apparatus according to claim 1, wherein said bearing unit includes a plurality of static pressure fluid bearings, and fluid pressures of said plurality of static pressure fluid bearings are controlled separately.

4. The apparatus according to claim 1,
    wherein said bearing unit includes a plurality of static pressure fluid bearings, and
    said apparatus further comprises a gas recovery portion which recovers a gas supplied from said static pressure fluid bearings.

5. The apparatus according to claim 1, wherein said moment reducing unit includes a permanent magnet.

6. The apparatus according to claim 1, wherein said moment reducing unit includes an electromagnetic actuator.

7. The apparatus according to claim 6, further comprising a sensor which measures one of a position and an attitude of said movable element,
    wherein said electromagnetic actuator is controlled on the basis of an output from said sensor.

8. The apparatus according to claim 7, further comprising a reference structure,
    wherein said bearing unit is arranged between said reference structure and said movable element, and
    said sensor is arranged to measure a gap between said reference structure and said movable element.

9. A stage apparatus including a supporting apparatus and a movable element according to claim 1,
    wherein each of said bearing unit and said moment reducing unit includes a magnetic force generation source, and
    at least a surface of said movable element which opposes said bearing unit includes a magnetic material.

10. The apparatus according to claim 9, wherein a surface of said movable element which opposes said moment reducing unit includes a magnetic material.

11. The apparatus according to claim 9, wherein a surface of said movable element which opposes said moment reducing unit includes a magnetic force generation source.

12. The apparatus according to claim 10,
    wherein said magnetic force generation source of at least said moment reducing unit comprises an electromagnet,
    said apparatus further comprises a sensor which measures one of a position and an attitude of said movable element, and
    an electromagnet of said moment reducing unit is controlled on the basis of an output from said sensor.

13. The apparatus according to claim 11, wherein at least one of said magnetic force generation source of said moment reducing unit and said surface which opposes said moment reducing unit comprises an electromagnet.

14. The apparatus according to claim 13, further comprising a sensor which measures one of a position and an attitude of said movable element,
    wherein said electromagnet is controlled on the basis of an output from said sensor.

15. The apparatus according to claim 12, further comprising a reference structure,
    wherein said bearing unit is arranged between said reference structure and said movable element, and
    said sensor is arranged to measure a gap between said reference structure and said movable element.

16. An exposure apparatus wherein a supporting apparatus according to claim 1 supports at least one of a reticle stage and a wafer stage.

17. An exposure apparatus wherein a stage apparatus according to claim 9 comprises at least one of a reticle stage and a wafer stage.

18. A device manufacturing method comprising:
    a step of exposing a wafer using an exposure apparatus according to claim 16; and
    a step of developing the wafer.

19. A device manufacturing method comprising:
    a step of exposing a wafer using an exposure apparatus according to claim 17; and
    a step of developing the wafer.

20. A supporting apparatus for supporting a movable element, comprising:
    a bearing unit which supports said movable element; and
    a first member, wherein attraction force is generated between said first member and said movable element,
    wherein said bearing unit includes a static pressure fluid bearing, a gas recovery portion which recovers gas supplied from said static pressure fluid bearing and a second member, wherein attraction force is generated between said second member and said movable element,
    said static pressure fluid bearing and said second member are surrounded by said gas recovery portion, and
    said first member is arranged outside said gas recovery portion.

* * * * *